United States Patent
Kiminami et al.

(10) Patent No.: US 7,683,632 B2
(45) Date of Patent: Mar. 23, 2010

(54) SPECIFIC ABSORPTION RATE MEASUREMENT SYSTEM AND METHOD

(75) Inventors: Katsuki Kiminami, Yokosuka (JP); Takahiro Iyama, Yokohama (JP); Teruo Onishi, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 322 days.

(21) Appl. No.: 11/873,934

(22) Filed: Oct. 17, 2007

(65) Prior Publication Data

US 2008/0265902 A1 Oct. 30, 2008

(30) Foreign Application Priority Data

Oct. 23, 2006 (JP) .............................. 2006-287607
Apr. 23, 2007 (JP) .............................. 2007-113533

(51) Int. Cl.
*G01R 27/04* (2006.01)

(52) U.S. Cl. ..................... 324/632; 324/457; 324/76.11; 343/703

(58) Field of Classification Search ................. 324/632, 324/76.11; 343/703
See application file for complete search history.

(56) References Cited

U.S. PATENT DOCUMENTS

| | | | |
|---|---|---|---|
| 6,919,845 B2 * | 7/2005 | Ozaki et al. ................. | 343/703 |
| 7,186,377 B2 | 3/2007 | Iyama et al. | |
| 2004/0232776 A1 * | 11/2004 | Ozaki et al. ................. | 307/149 |
| 2006/0012530 A1 | 1/2006 | Onishi et al. | |
| 2006/0114003 A1 | 6/2006 | Onishi et al. | |
| 2006/0172432 A1 | 8/2006 | Iyama et al. | |
| 2007/0236229 A1 | 10/2007 | Onishi et al. | |

FOREIGN PATENT DOCUMENTS

JP   2006-47297   2/2006

OTHER PUBLICATIONS

Thomas Schmid et al., "Automated E-Field Scanning System for Dosimetric Assessments", IEEE Transactions on Microwave Theory and Techniques, vol. 44, No. 1, Jan. 1996, pp. 105-113.
Michael Y. Kanda et al., "Faster Determination of Mass-Averaged SAR From 2-D Area Scans", IEEE Transactions on Microwave Theory and Techniques, vol. 52,No. 8, Aug. 2004, pp. 2013-2020.

(Continued)

*Primary Examiner*—Vincent Q Nguyen
(74) *Attorney, Agent, or Firm*—Oblon, Spivak, McClelland, Maier & Neustadt, L.L.P.

(57) ABSTRACT

A disclosed specific absorption rate measurement system according to an embodiment of the present invention measures a specific absorption rate of electromagnetic waves from a radiating source absorbed in a dielectric medium. The system includes a measurement portion that measures a first electric field vector on an observation surface which is a two-dimensional surface in the dielectric medium; an electric field calculation portion that calculates a second electric field vector in a point excluded from the observation surface in accordance with electric field components of the first electric field vector measured on the observation surface, the electric field components being parallel to the observation surface; and a calculation portion that calculates the specific absorption rate from the calculated second electric field vector.

20 Claims, 27 Drawing Sheets

OTHER PUBLICATIONS

O. Merckel et al., "Parametric Model Approach for Rapid SAR Measurements", IMTC 2004, Instrumentation and Measurement Technology Conference, May 18-20, 2004, pp. 178-183.

A Cozza, "A New Probe-Array Approach for Fast SAR Measurements" International Workshop on Antenna Technology, Mar. 2007, pp. 157-161.

Katsuki Kiminami, et al., "Rigorous Estimation Method of SAR Distribution Based on Surface Scanned Electric Field", 2006 IEEE Antennas and Propagation Society International Symposium, XP 002467678, Jul. 9, 2006, pp. 465-468.

Teruo Onishi, et al., "Estimation Method Based on the Surface Scanned EM Field Data With Respect to SAR Measurement", URSI, XP 002467765, Oct. 2005, pp. 1-4.

* cited by examiner

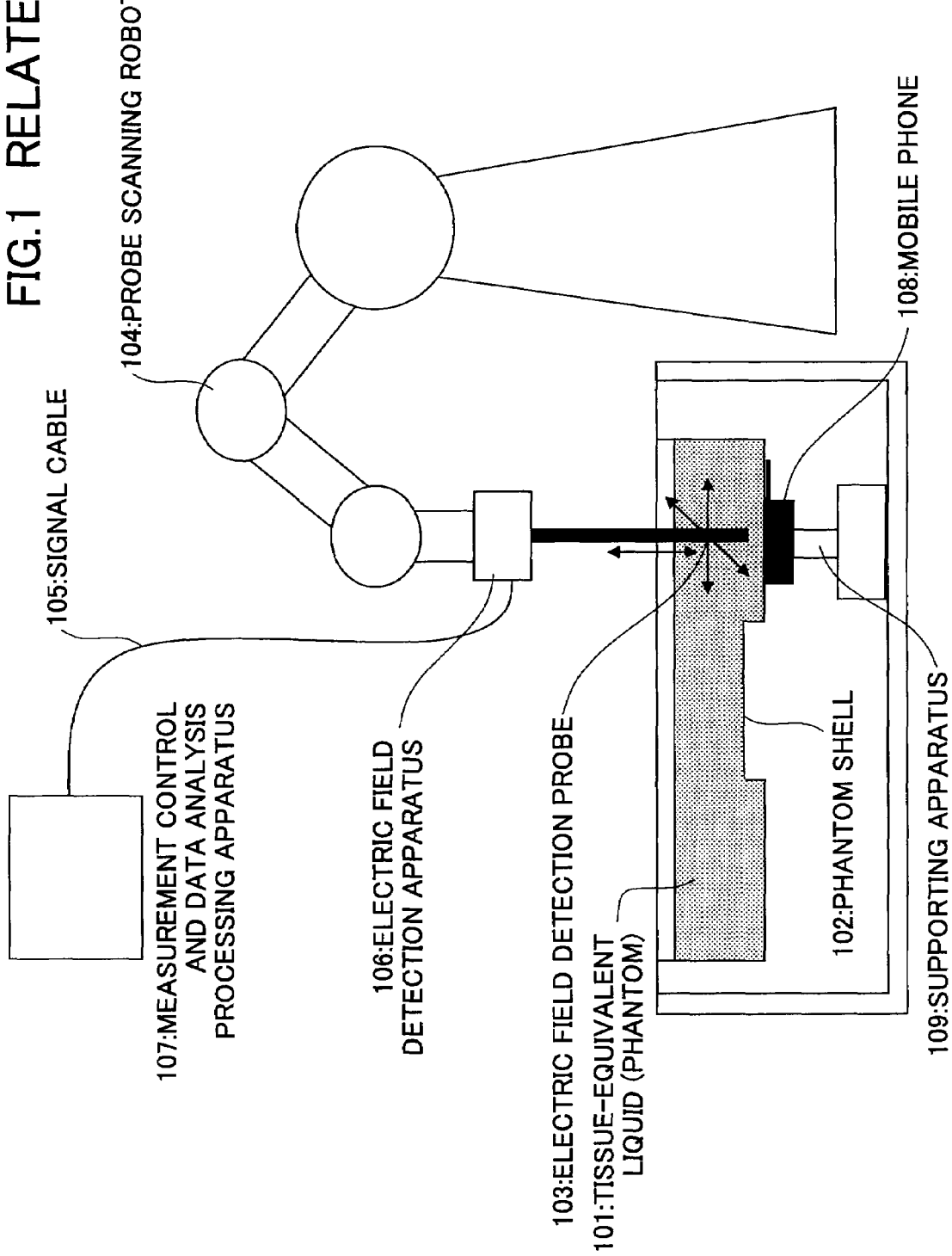

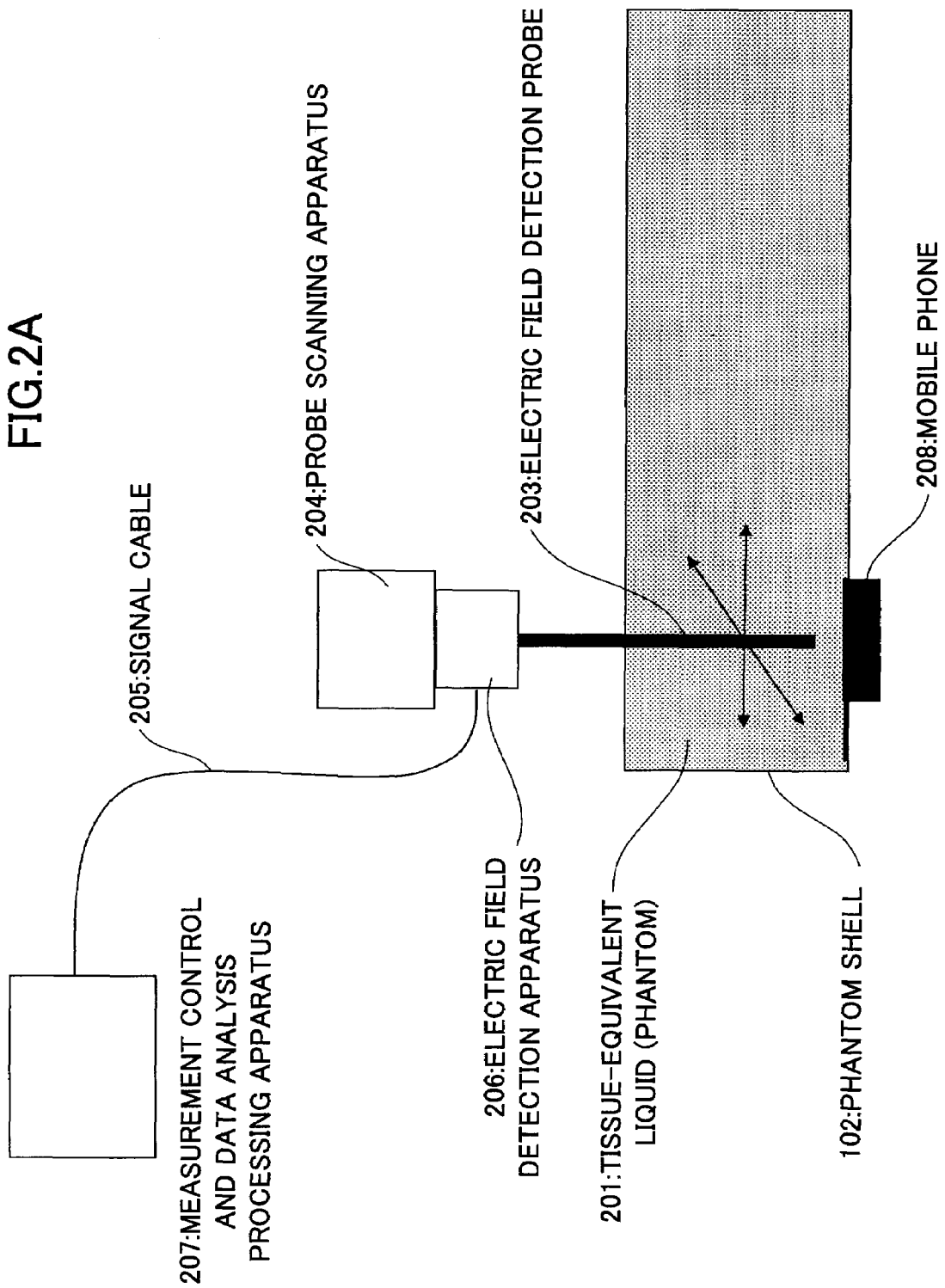

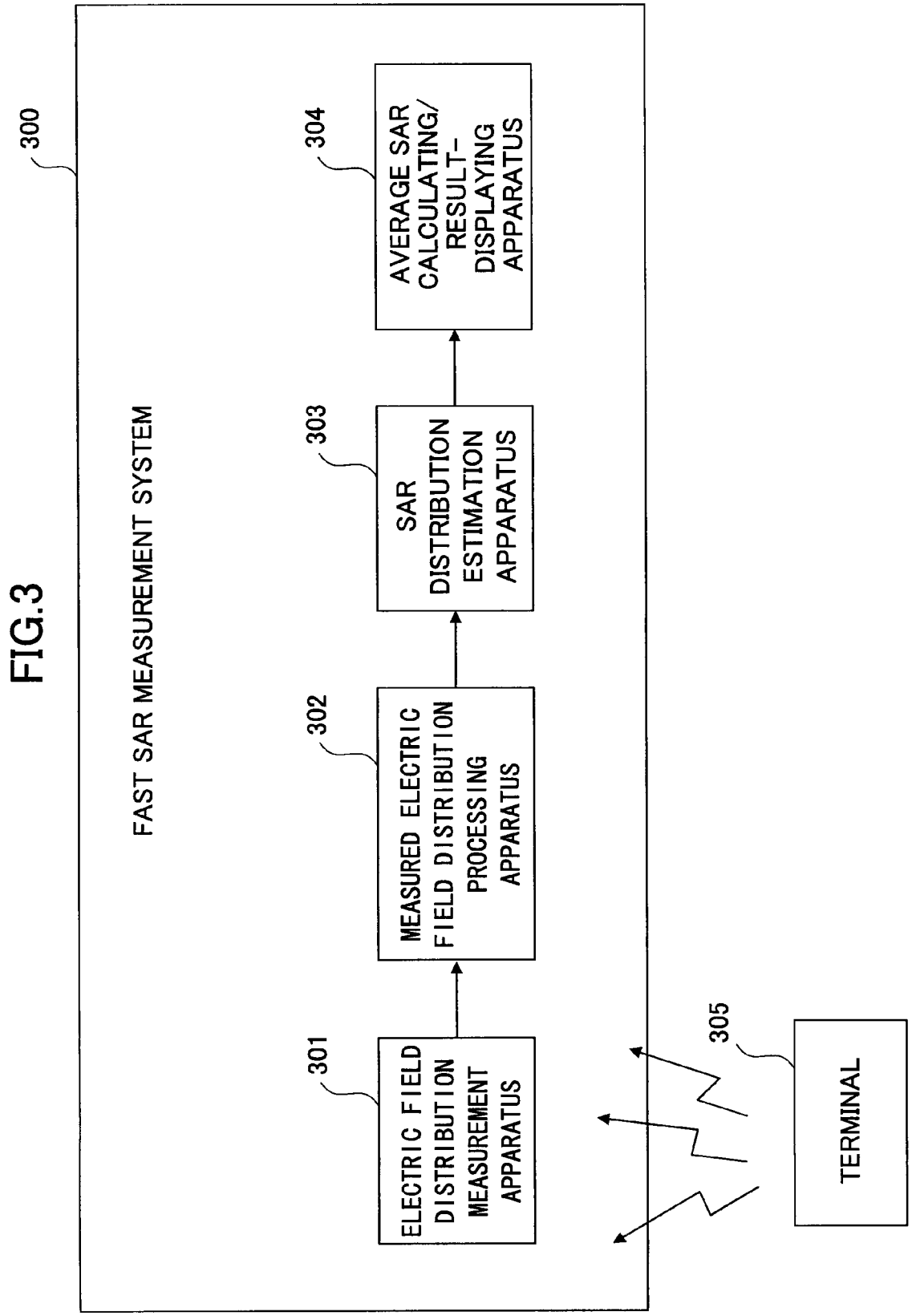

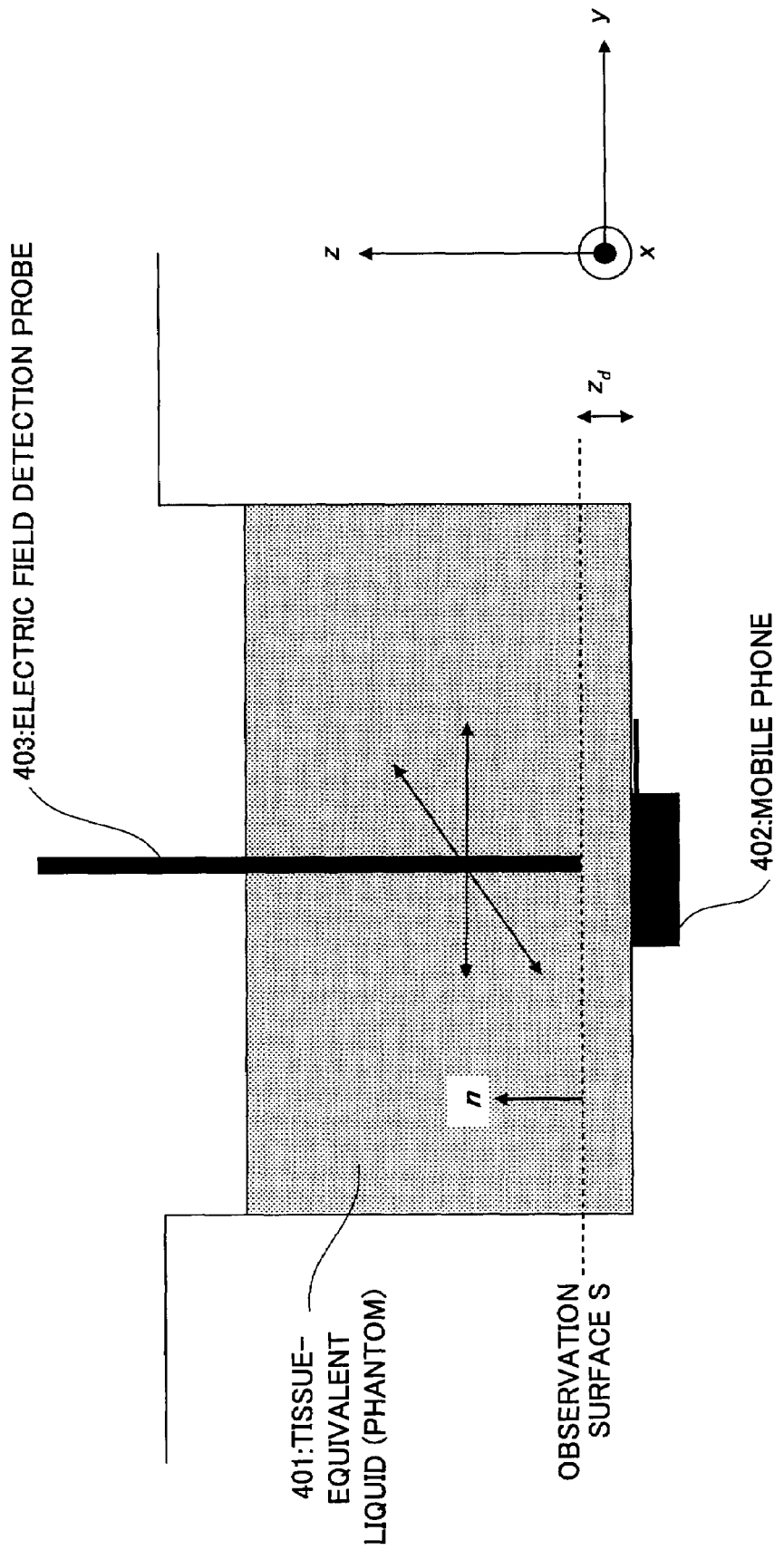

FIG.17
| (CALCULATED VALUE) | ($\Delta$ measure = 1.0mm, $\Delta$z = 1.0mm) |
|---|---|
| 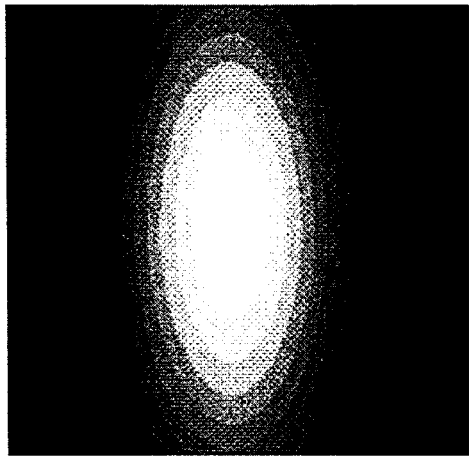 | 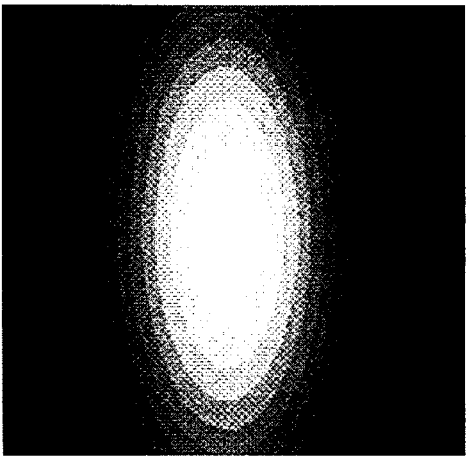 |
| ($\Delta$ measure = 2.0mm, $\Delta$z = 1.0mm) | ($\Delta$ measure = 4.0mm, $\Delta$z = 1.0mm) |
| 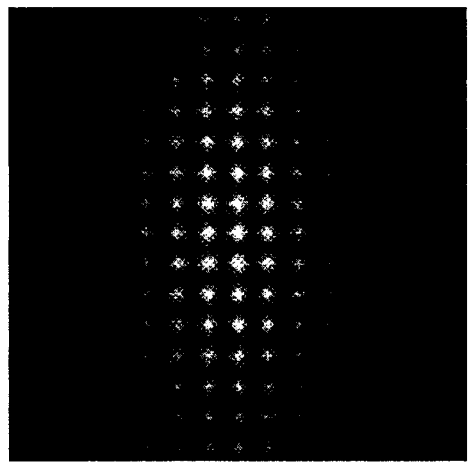 | 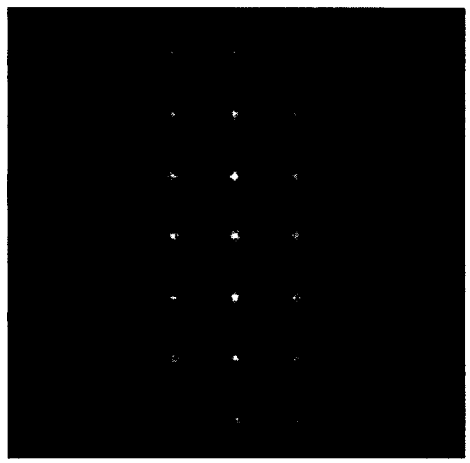 |

SPECIFIC ABSORPTION RATE MEASUREMENT SYSTEM AND METHOD

BACKGROUND OF THE INVENTION

1. Field of the Invention

The present invention relates to a measurement system and a method which measure a Specific Absorption Rate (SAR) at which electromagnetic energy from a radiating source, such as a mobile phone or the like, is absorbed in a dielectric medium during exposure.

2. Description of the Related Art

A Specific Absorption Rate (SAR) is a rate at which electromagnetic energy from a radiating source is absorbed in a dielectric medium and specifically defined as a value proportional to the second power of electric field strength ($|E|^2$) as expressed by the numeric equation (1).

$$SAR = \frac{\sigma |E|^2}{\rho} \quad (1)$$

where σ represents the electric conductivity (S/m) of a dielectric medium, and ρ is the density (kg/m$^3$) of the medium. The unit of measurement of SAR is W/kg. The SAR is specifically used to evaluate electric energy absorbed in a human body when a mobile phone or the like is used near the human body (see non-patent document 1).

When measuring the SAR, the electromagnetic field generated in the dielectric medium is detected by an electric field probe using, for example, a small dipole antenna and a diode, and the measured electric field is converted into a SAR value in accordance with the equation (1).

FIG. 1 shows an example of a related art of SAR measurement system. This SAR measurement system includes tissue-equivalent liquid 101 (called "phantom") having predetermined dielectric constants so as to simulate a human body, a phantom shell 102, an electric field detection probe 103, a probe scanning robot 104, a signal cable 105, an electric field detection apparatus 106, and a measurement control and data analysis processing apparatus 107. In this measurement system, a mobile phone 108 as a radiating source is supported by a supporting apparatus 109 and the electromagnetic field generated in the phantom by the mobile phone 108 is measured. Specifically, the electromagnetic field in the phantom is 3-dimensionally measured by the electromagnetic probe 103 scanned by the probe scanning robot 104, and thus a 3-dimentional SAR distribution is obtained.

However, since this method takes a long time in measuring the SAR, an SAR measurement method as follows has been proposed for the purpose of reducing measurement time. Namely, the electromagnetic field and thus SAR in the medium is measured only 2-dimensionally and the SAR distribution along the remaining direction (phantom depth direction) is empirically estimated, thereby realizing a faster measurement in this proposal. (see non-patent document 2). In addition, there has been proposed another method where the 2-dimensional SAR data and the SAR data in phantom depth obtained along only one line in the depth direction are used to estimate the 3-dimensional SAR distribution using an appropriate approximate expression (see non-patent document 3). Moreover, there has been yet another proposal where two different sets of 2-dimensional data of amplitude and phase of electric field or magnetic field are measured and the SAR distribution in phantom depth is calculated in accordance with the two sets of the 2-dimentional data so as to estimate the 3-dimensional SAR distribution (see patent-related document 1).

[Patent-related document 1] Japanese Patent Application Laid-Open Publication No. 2006-47297.

[Non-patent document 1] Thomas Schmid, Oliver Egger, and Niels Kuster, "Automated E-Field Scanning System for Dosimetric Assessment," IEEE Trans. Microwave Theory and Tech., Vol. 44, No. 1, pp. 105-113, January 1996.

[Non-patent document 2] M. Y. Kanda, M. G. Douglas, E. D. Mendivil, M. Ballen, A. V. Gessner, and C. K. Chou, "Fast Determination of Mass-Averaged SAR from 2-D Area Scans," IEEE Trans. Microwave Theory and Tech, Vol. 52, No. 8, pp. 2013-2020, August 2004.

[Non-patent document 3] O. Marckel, J. Ch. Bolomey, and G. Fleury, "Parametric model approach for rapid SAR measurements", IMTC2004, Instrumentation and Meas. Tech. Conf., pp. 178-183, Como, Italy, May 2004.

SUMMARY OF THE INVENTION

Such SAR distribution estimation methods where the SAR distribution in phantom depth is estimated empirically or approximately in accordance with the 2-dimensional measurement utilize an empirical rule or an approximate expression. Therefore, it is difficult to enable a highly accurate estimation of the 3-dimensional SAR distribution, especially under situations where the SAR distribution in the medium depends strongly on types of mobile phones or the like.

In addition, in the SAR distribution method where an unmeasured magnetic or electrical field distribution is estimated from the measured amplitude and phase of the electric or magnetic field so as to theoretically estimate the 3-dimensional SAR distribution, it is necessary to measure the 2-dimensional electromagnetic distributions on two different surfaces, which increases the number of measurement points. The unnecessarily large number of measurement points makes a scanning method and/or arrangement of a sensor apparatus complicated, and requires additional calculations of the magnetic or electric field, which may lead to a problem of increased measurement time.

The present invention is directed to highly accurate measurement of the 3-dimensional SAR distribution with simplified SAR estimation procedures.

According to an embodiment of the present invention, a specific absorption rate measurement system is used which obtains a specific absorption rate at which electromagnetic waves from a radiating source are absorbed in the dielectric medium. This system includes a measurement portion that measures a first electric field vector on an observation surface which is a two-dimensional surface in the dielectric medium; an electric field calculation portion that calculates a second electric field vector at a point excluded from the observation surface in accordance with electric field components of the first electric field vector measured on the observation surface, the electric field components being parallel to the observation surface; and a calculation portion that calculates the specific absorption rate from the calculated second electric field vector.

According to another embodiment of the present invention, the SAR estimation procedures and the measurement system can be simplified, and a highly accurate 3-dimensional SAR distribution can be calculated in a reduced period of time.

BRIEF DESCRIPTION OF THE DRAWINGS

Other objects, features and advantages of the present invention will become more apparent from the following detailed description when read in conjunction with the accompanying drawings, in which:

FIG. 1 shows a related-art of SAR measurement system;

FIG. 2A is a schematic view of a fast SAR measurement system according to a first example of the present invention;

FIG. 3 is a functional block diagram of a fast SAR measurement process according to the first example of the present invention;

FIG. 4 schematically shows how to use the fast SAR measurement system of FIG. 2;

FIG. 17 shows SAR distributions calculated for several combinations of data intervals $\Delta$measure and a position $\Delta z$ of an estimation surface;

DETAILED DESCRIPTION OF THE PREFERRED EMBODIMENTS

Figure 2B:
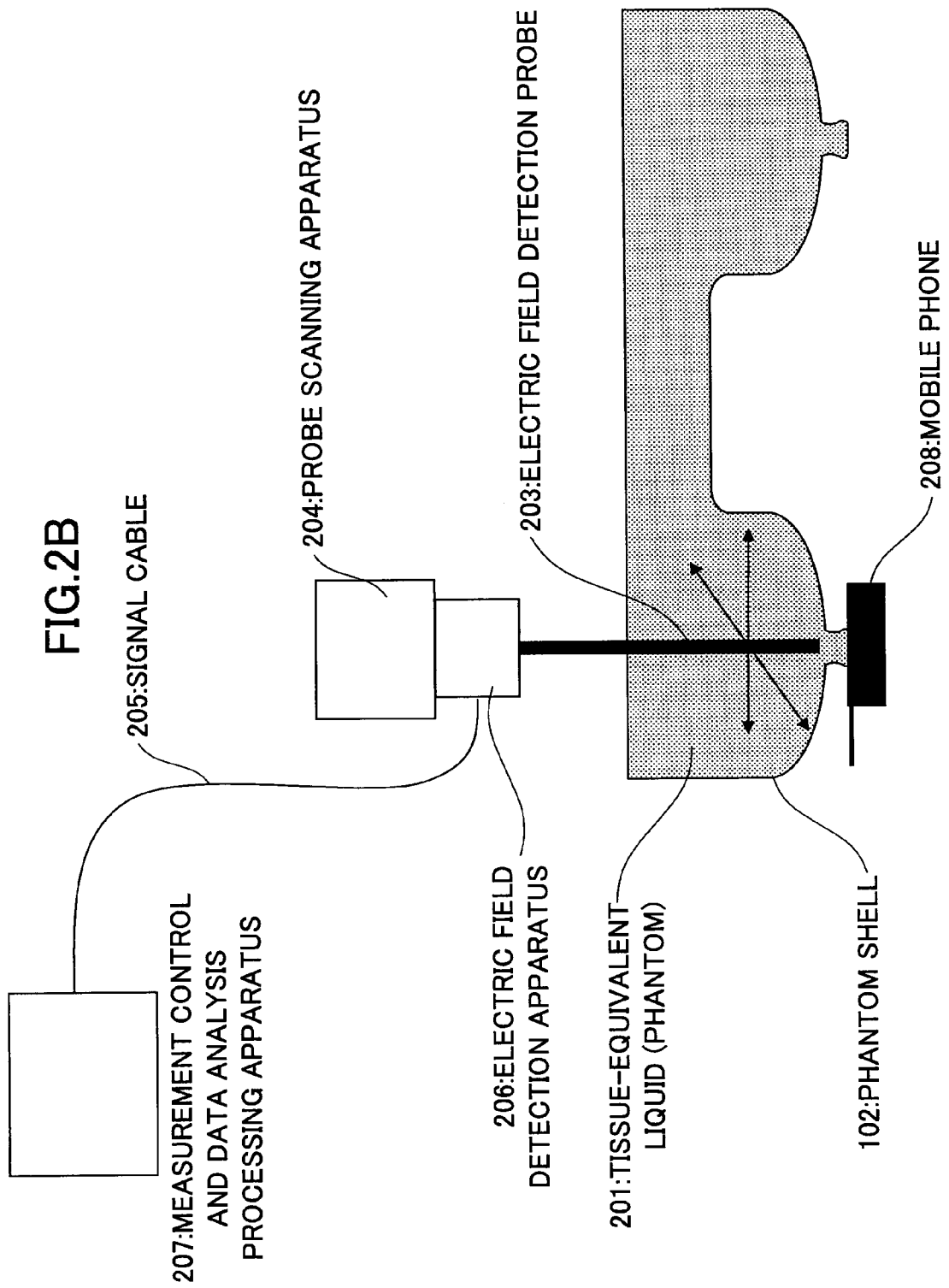
FIG. 2B is a schematic view of a fast SAR measurement system having another type of a phantom shell, according to the first example of the present invention.

According to a first aspect of the present invention, a 3-dimensional specific absorption rate (SAR) distribution is theoretically estimated from a 2-dimensional measured distribution of an electric field in the dielectric medium in order to measure the SAR which is a rate at which electromagnetic waves from a mobile phone or the like are absorbed in the medium, thereby enabling a fast, simplified, and highly accurate SAR measurement.

In an SAR measurement system according to an embodiment of the present invention, the dielectric medium is so large that incidence of the electromagnetic waves from the mobile phone on surfaces except for the phantom surface that faces the mobile phone is negligible and the phantom is so large that reflection of the electromagnetic waves inside the phantom is negligible. The system includes an electric field distribution measurement portion that measures amplitude and phase of the electric field on an arbitrary 2-dimensional surface (observation surface) in the dielectric medium, an electric field distribution estimation portion that estimates a 3-dimensional distribution of the electric fields at another point in the medium in accordance with electric field components of the measured electric field that are parallel to the 2-dimensional surface, and a SAR distribution calculation portion that calculates a 3-dimensional SAR distribution in accordance with three electric field components of the measured electric field or the estimated electric field. This system can calculate the 3-dimensional SAR distribution and a spatial average SAR from only measurement results of the electric field components parallel to the observation surface, thereby enabling a fast, highly accurate SAR measurement by a simplified configuration.

In the system, there may be prepared an optical probe using an electro-optical crystal or a small dipole antenna and optical waveguide modulator as the electric field distribution measurement portion in order to measure the 2-dimensional amplitude-and-phase distribution of the electric field in the medium. This makes it possible to concurrently measure the amplitude and phase in a very simplified configuration.

In the system, the electric field distribution measurement portion may be composed of plural electric field detection probes so as to measure the 2-dimensional amplitude-and-phase distribution of the electric field in the medium. This can reduce measurement time, compared with a situation where a single probe is scanned to measure the 2-dimensional electric field distribution.

The electric field distribution estimation portion performs a surface integral over the observation surface on all vectors obtained from a first exterior product $((n \times E_{2d}) \times (\nabla' \phi))$ equaling an exterior product of a second exterior product $(n \times E_{2d})$ and a gradient of Green's function $(\nabla' \phi)$, the second exterior product being an exterior product of electric field components parallel to the observation surface and a normal vector to the observation surface, so as to calculate the second electric field vector at the point excluded from the observation surface.

Example 1

FIG. 2A is a schematic view of a fast SAR measurement system according to a first example of the present invention. As shown, the fast SAR measurement system includes tissue-equivalent liquid (phantom) 201 having predetermined dielectric constants so as to simulate a human body, a phantom shell 202, an electric probe 203, a probe scanning apparatus 204, a signal cable 205, an electric field detection apparatus 206, and a measurement control and data analysis processing apparatus 207. In this system, a radio terminal apparatus such as a mobile phone 208 or the like is attached on the phantom shell 202 as shown FIG. 2A, and the electric field generated in the phantom 201 is measured. The radio terminal apparatus may be, for example but not limited to, a personal digital assistance (PDA), a desk top computer, a hand-held computer, a credit card identification terminal, a camera, and a wearable computer, all of which have a radio communications function or a network connectable function. In addition, the shape of the phantom shell 202 is not limited to the shown shape but may emulate the shape of a temporal region of the human head as shown in FIG. 2B.

FIG. 3 is a functional block diagram of the fast SAR measurement system shown in FIG. 2A. A fast SAR measurement system 300 includes an electric field distribution measurement apparatus 301, a measured electric field distribution processing apparatus 302, a SAR distribution estimation apparatus 303, and an average SAR calculating/result-displaying apparatus 304. In FIG. 3, a radio terminal 305 as a radiating source is also illustrated.

The electric field distribution measurement system 301 provides functions that are to be demonstrated by the apparatuses 201 to 207 in FIG. 2A. As shown in FIG. 4, which is a detailed representation of the measurement configuration, amplitude and phase of an electric field on a 2-dimensional surface (referred to as an observation surface S, below) positioned at a distance of $z_d$ from the phantom surface (the bottom of the phantom shell 202 (FIG. 2A)) are measured using the electric field detection probe 403. The distance $z_d$ is specifically determined in accordance with a characteristic of the electric field detection probe 403 used, while the distance is preferably shorter. For example, the distance $z_d$ is 5.0 mm or less. The probe 403 may be composed of appropriate members and/or components known in this field of technology. For example, the probe 403 may be composed of an optical probe including an electro-optic (EO) crystal. Or, the probe 403 may be composed of an electric field probe using a small dipole antenna and an optical waveguide modulator.

The measured electric field distribution processing apparatus 302 performs pre-processing on the 2-dimensional electric field distribution measured by the electric field distribution measurement system 301 in such a manner that the measured values become suitable to calculate the specific absorption rate (SAR) distribution. For example, when data intervals are too wide to accurately estimate the SAR distribution, various interpolation methods such as the cubic spline interpolation, linear interpolation or the like are used so as to obtain the electric field distribution at desired intervals. However, the measured electric field distribution processing apparatus 302 is not necessary for the fast SAR measurement system 300. It should be determined from the intervals of the data obtained by the electric field distribution measurement system 301 whether the measured electric field distribution processing apparatus 302 is required, or how the measured electric field distribution processing apparatus 302 operates.

The SAR distribution estimation apparatus 303 estimates the 3-dimensional SAR distribution using electric field vectors measured on the observation surface S. First, the 3-dimensional electric field distribution $E_{est}(x, y, z)$ is calculated by applying the 2-dimensional electric field distribution $E_{2d}(x, y)$ measured on the observation surface S to the equation (2). By the way, the observation surface S is set as the xy-plane and the direction of phantom depth is taken along the z axis, as shown in FIG. 4.

$$E_{est}(x, y, z) = -\frac{1}{2} \int_S [\{n \times E_{2d}(x, y)\} \times \nabla' \phi] dS \quad (2)$$

$$\phi = \frac{e^{-jk|r-r'|}}{|r-r'|} \quad (3)$$

where, ø represents the Green's function defined as equation (3).

In the equation (2), n is a normal unit vector extending in the positive direction of the z axis; and S is the observation surface positioned at the depth $Z_d$. The vector r is a position vector pointing to a coordinate point on the observation surface S; and the vector r' is a position vector pointing to a coordinate point in the dielectric medium. Namely, the equation (2) is used to calculate the 3-dimensional distribution of the electric field produced in the dielectric medium (phantom) in accordance with the measured 2-dimensional electric distribution $E_{2d}(x, y)$. As can be understood by equation (2), an exterior product of the normal vector n and the measured 2-dimensional electric field distribution $E_{2d}(x, y)$ leads to the 3-dimensional electric field distribution and thus the 3-dimensional SAR distribution. In addition, it should be noted that the equation (2) includes the 2-dimensional electric field distribution but does not include magnetic field distribution, in contrast to the prior art of SAR estimation method.

In this example of the measurement method, it is assumed that incidence of the electromagnetic waves from the mobile phone or the like on surfaces (yz-plane or zx-plane in FIG. 4) except for the phantom surface (xy-plane in FIG. 4) that faces the mobile phone or the like is negligible and the phantom is so large that reflection of the electromagnetic waves inside the phantom is negligible. For example, the above assumptions will be satisfied when the maximum value of electromagnetic field on the phantom surfaces excluding the phantom surface that faces the radiating source becomes −20 dB or less of the electromagnetic waves incident from the phantom surface that faces the radiating source and when the phantom depth is 100 mm or more. Under these assumptions, the equation (2) is applicable to the above SAR measurement. The method of this example measures three components of the electric field on an arbitrary 2-dimensional surface in the phantom, estimates the 3-dimensional electric field distribution from the measured electric field components (for example, x, y, and z components in the Cartesian coordinate system) using the equation (2), and calculates the 3-dimensional SAR distribution $SAR_{3d}(x, y, z)$ using the calculated 3-dimensional electric field distribution and the equation (4).

$$SAR_{3d}(x, y, z) = \frac{\sigma |E_{est}(x, y, z)|^2}{\rho} \quad (4)$$

Figure 5:
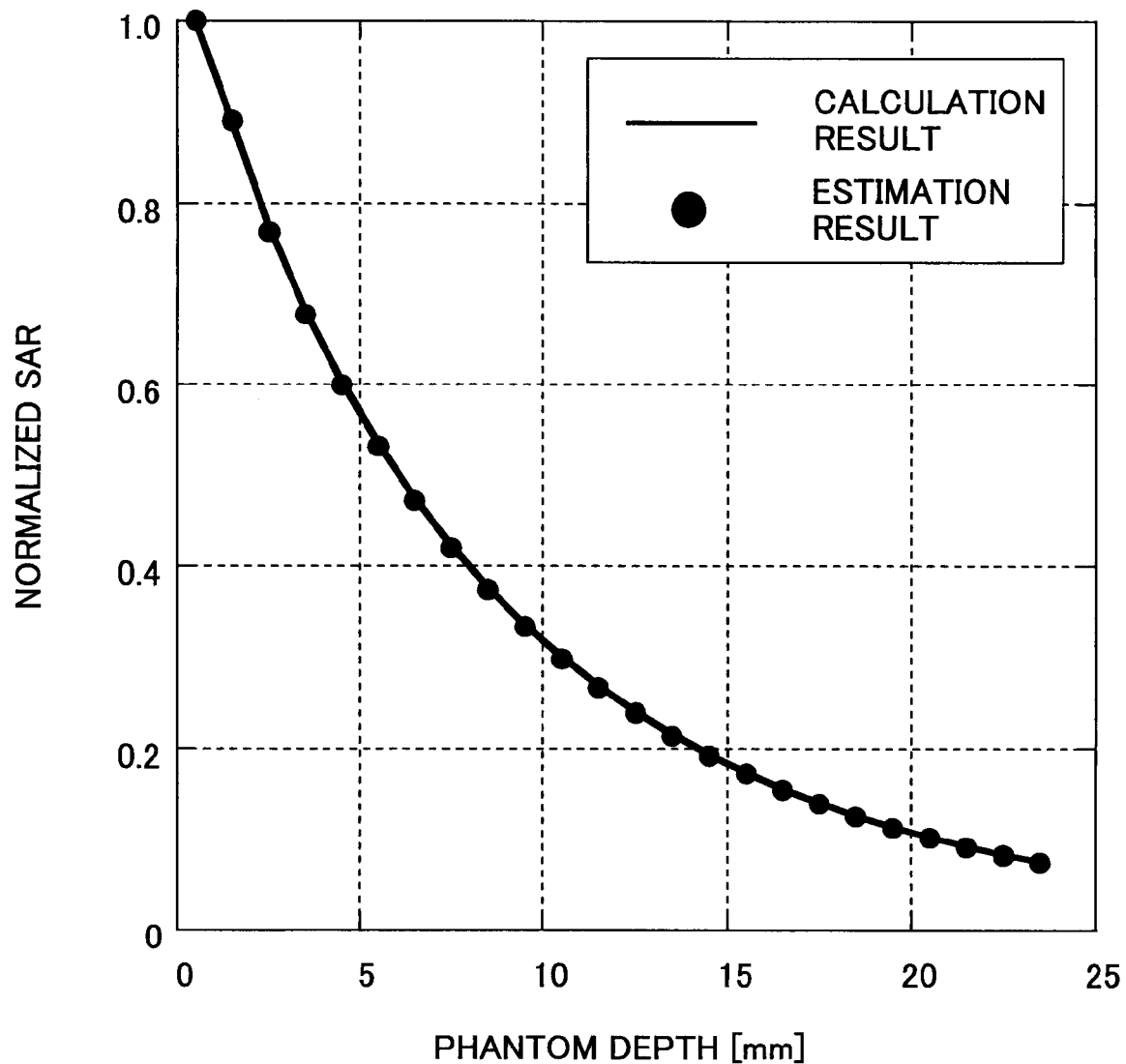
FIG. 5 shows an SAR distribution estimation result obtained by using a 1950 MHz half wavelength dipole antenna.

FIG. 5 shows adequacy of the estimation method of this example by calculation. Specifically, FIG. 5 illustrates a SAR calculation curve obtained by the Finite-difference time-domain method and SAR estimation data obtained according to this example (the SAR distribution in phantom depth (z-direction) estimated by the equations (2) and (4) using the 2-dimensional electric field distribution). By the way, a half wavelength dipole antenna is positioned in the vicinity of the phantom instead of an actual mobile phone terminal in this experiment. In addition, the frequency of the electromagnetic field emitted from the dipole antenna is 1950 MHz.

It is shown from FIG. 5 that the estimation method according to this example can estimate the SAR distribution with high accuracy. The same results have been obtained using different frequencies. Therefore, it has been found that use of the equations (2) and (4) along with the measured 2-dimensional electric field distribution can estimate the 3-dimensional SAR distribution.

The average SAR calculating/result-displaying apparatus 304 has functions of calculating a spatial average SAR in accordance with the 3-dimensional SAR distribution estimated in the SAR distribution estimation apparatus 303, and displaying the measurement results of the spatial average SAR, the 3-dimensional SAR distribution and the like.

Figure 6:
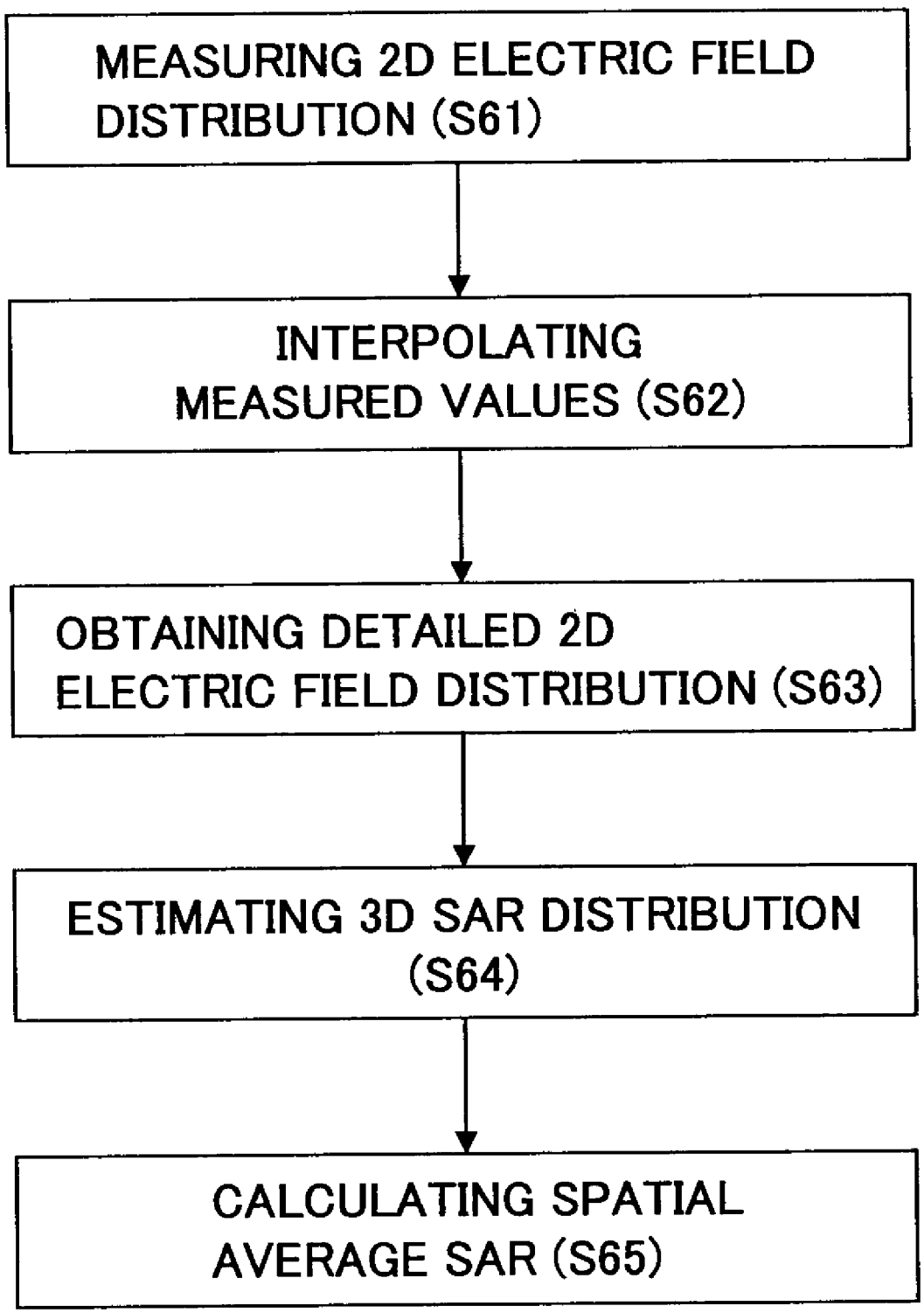
FIG. 6 is a flowchart illustrating operations of the fast SAR measurement system according to the first example of the present invention.

FIG. 6 is a flowchart illustrating operations of the fast SAR measurement system according to this example of the present invention. First, the amplitude and phase of the electric field are 2-dimensionally measured by the probe and thus the electric field on the observation surface S in the dielectric medium is measured (S61). Taking account of the measurement intervals of the measured 2-dimensional electric field distribution, any one of various interpolation methods may be applied to interpolate the measured data (S62). With this, a detailed 2-dimensional electric field distribution $E_{2d}(x, y)$ is obtained (S63). For example, it is assumed that the 2-dimentional electric field distribution may be measured at measurement intervals of 8.0 mm while measurement intervals of 1.0 mm are required in order to obtain the highly accurate 3-dimensional SAR distribution. In this case, the cubic spline interpolation is performed on the measured data obtained at the measurement intervals of 8.0 mm, thereby calculating the detailed 2-dimentional electric field distribution. Next, the calculated 2-dimensional electric field distribution $E_{2d}(x, y)$ is applied to the equations (2) through (4), thereby estimating the 3-dimensional SAR distribution $SAR_{3d}(x, y, z)$ (S64). Then, the spatial average SAR is calculated in accordance with the estimated 3-dimensional SAR distribution (S65).

In the fast SAR measurement system according to this example, since the 3-dimentional SAR distribution is estimated in accordance with the theoretical formulae (2) through (4), variations in SAR estimation accuracy which have occurred in the conventional art can be eliminated or reduced, thereby calculating the highly accurate 3-dimensional SAR distribution and the spatial average SAR values in a shorter time.

In the above example, the probe is scanned (moved) in the liquid medium (phantom) while the radio source (mobile phone) is firmly fixed. However, the mobile phone may be 2-dimensionally scanned while the sensor is firmly fixed.

Example 2

In the above Example 1, one electric field sensor (probe or the like) is used to measure the 2-dimensional electric field distribution. However, plural sensors may be arranged in array to measure the electric field distribution. When an array sensor is used, scanning time of the electric field sensor can be largely reduced, thereby enabling higher speed measurement of SAR. However, when plural sensors are concurrently used, it may become inconvenient to scan all the plural sensors according to circumstances. In this case, it is advantageous to make the mobile phone scannable.

Figure 7:
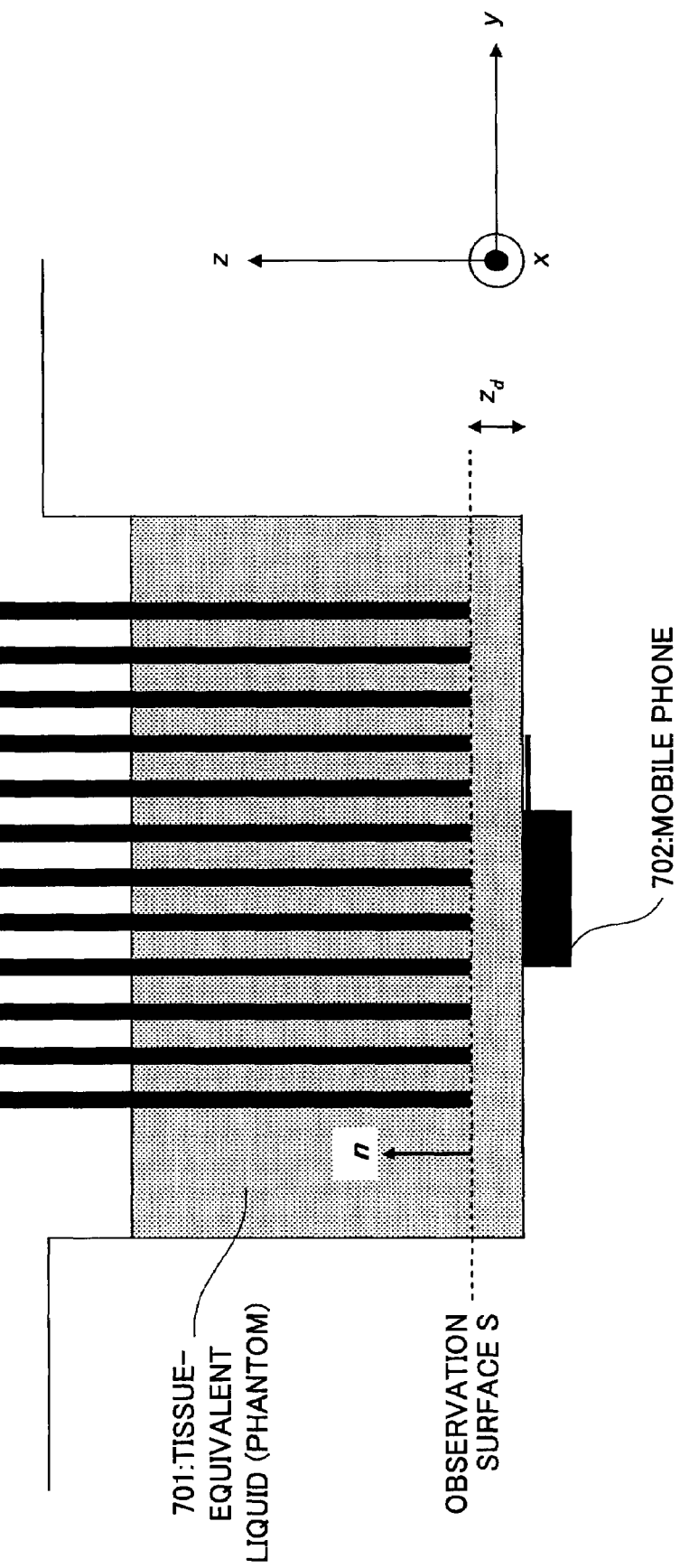
FIG. 7 is a schematic view of a fast SAR measurement system according to a second example of the present invention.

FIG. 7 shows a fast SAR measurement system according to a second example of the present invention. In the second example, plural probes 703 arranged in array are used for the measurement. As shown, plural probes are arranged at predetermined intervals in a measurement area in which the measurement on the 2-dimensional observation surface S is to be performed. The predetermined intervals may be 8.0 mm or less, for example. Although the radio source (namely, the mobile phone) is stably fixed in the first example, the radio source is scanned while keeping the sensor (plural probes 703) stable in the second example.

This example is more advantageous from the viewpoint of a shorter measurement time to accurately measure the electric field distribution on the 2-dimensional surface.

Example 3

Figure 8:
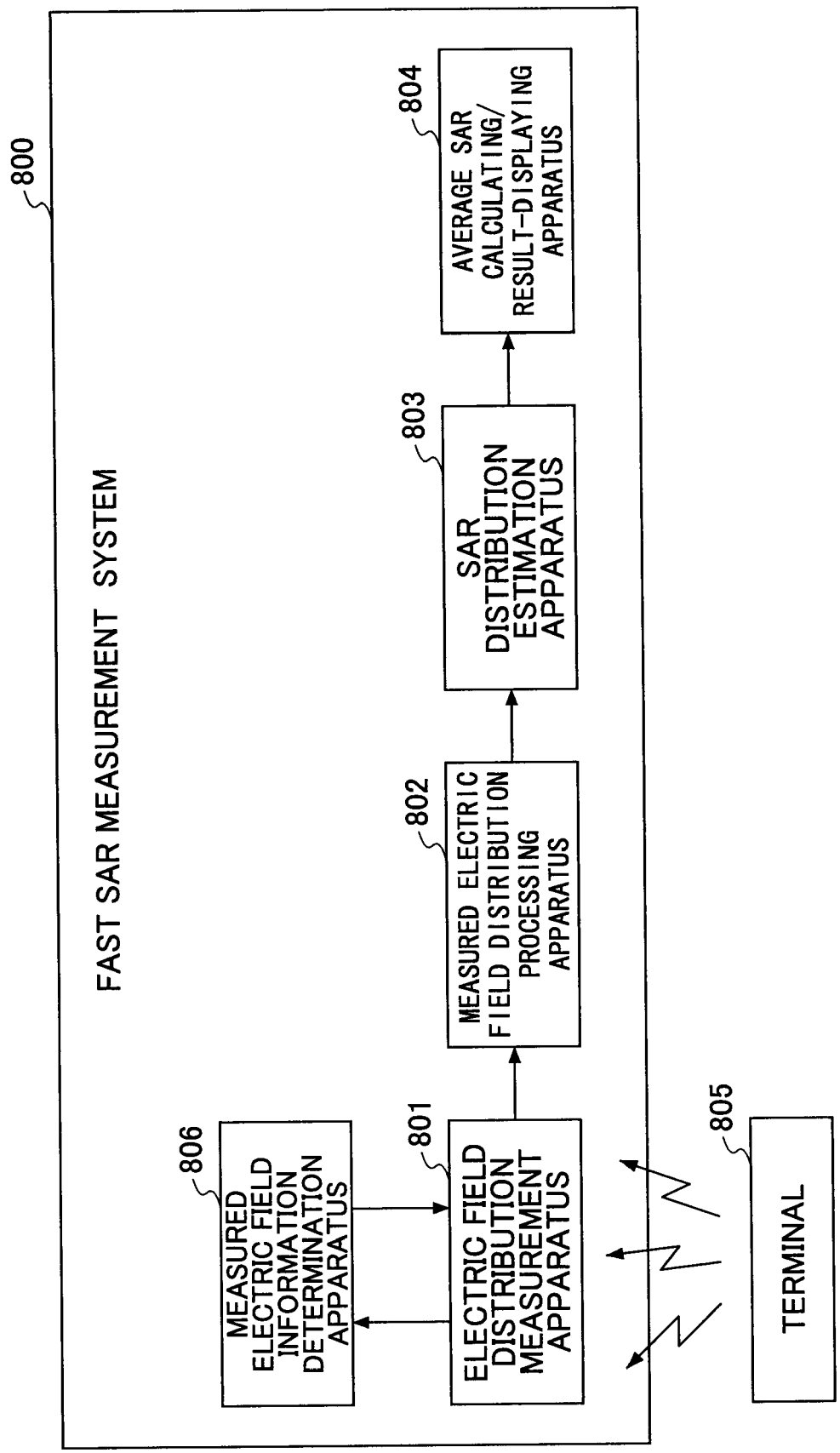
FIG. 8 is a functional block diagram of a fast SAR measurement process according to a third example of the present invention.

FIG. 8 is a functional block diagram of a fast SAR measurement process according to a third example of the present invention. In this example, a measured electric field information determination apparatus 806 controls an electric field distribution measurement system 801 so that both amplitude and phase are measured for the electric field components parallel to the observation surface S and only amplitude is measured for the electric field component perpendicular to the observation surface S.

Figure 9:
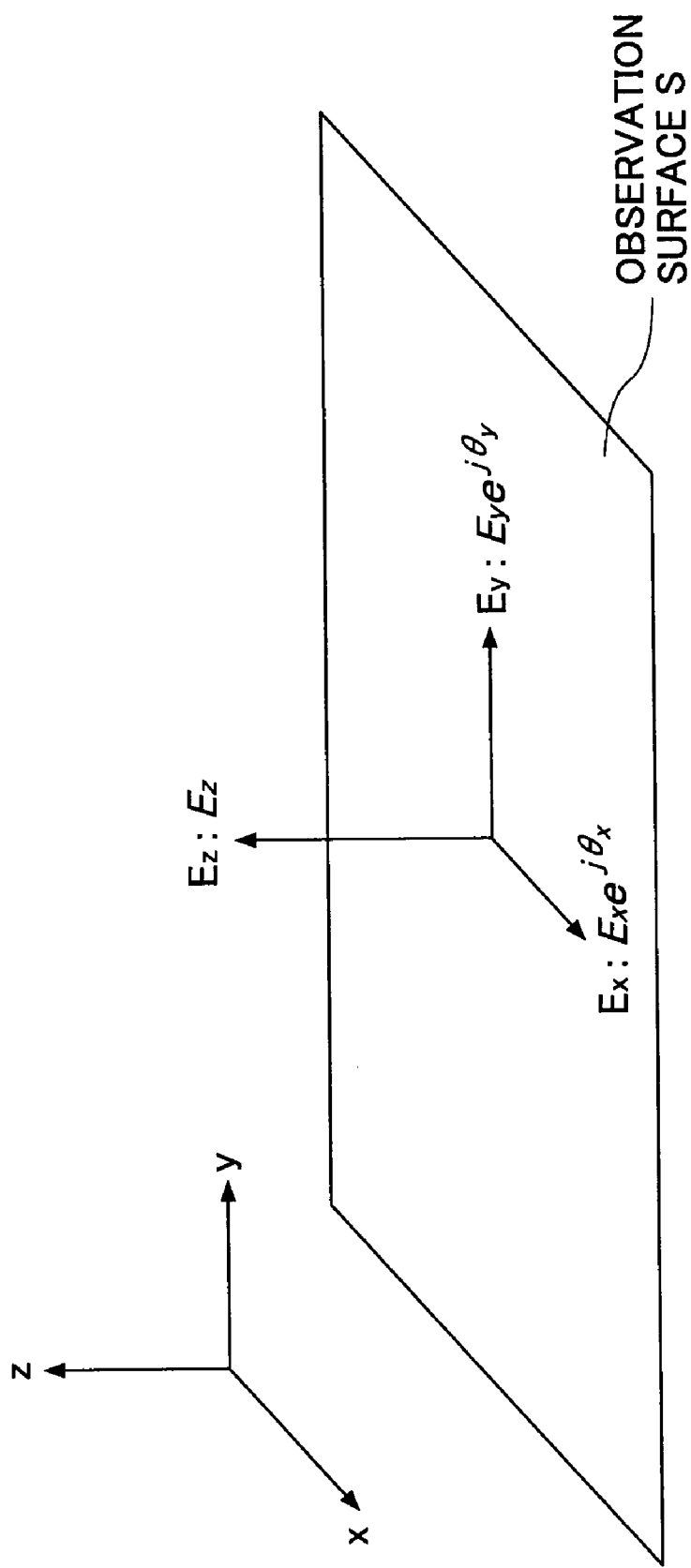
FIG. 9 shows electric field vectors in relation to an observation surface.

FIG. 9 shows electric field coordinates in relation to the observation surface S. In this figure, the observation surface S is formed as the xy-plane.

Therefore, both amplitude and phase ($E_x e^{j\theta x}$, $E_y e^{j\theta y}$) of the electric field components Ex, Ey parallel to the observation surface S are measured and only the amplitude of the electric field component Ez perpendicular to the observation surface S is measured. The electric field components in the dielectric medium away from the observation surface S are calculated using the above equations (2) and (3). Since the integrand of the equation (2) includes an exterior product of the normal vector n perpendicular to the observation surface S and the 2-dimensional electric field components, only the electric field components parallel to the observation surface S can contribute to the calculation result of the equation (2). In addition, although the electric field component perpendicular to the observation surface S does not contribute to the calculation result of the equation (2), the perpendicular component is necessary for calculating the result of equation (4). Therefore, the amplitude and phase of the electric field components parallel to the observation surface S and only the amplitude of the electric field component perpendicular to the observation surface S are measured in this example.

According to this example, since not all the amplitudes and phases are measured for the three directional electric field components, the number of measurements can be reduced, thereby enabling fast measurement and processes.

Example 4

Figure 10:
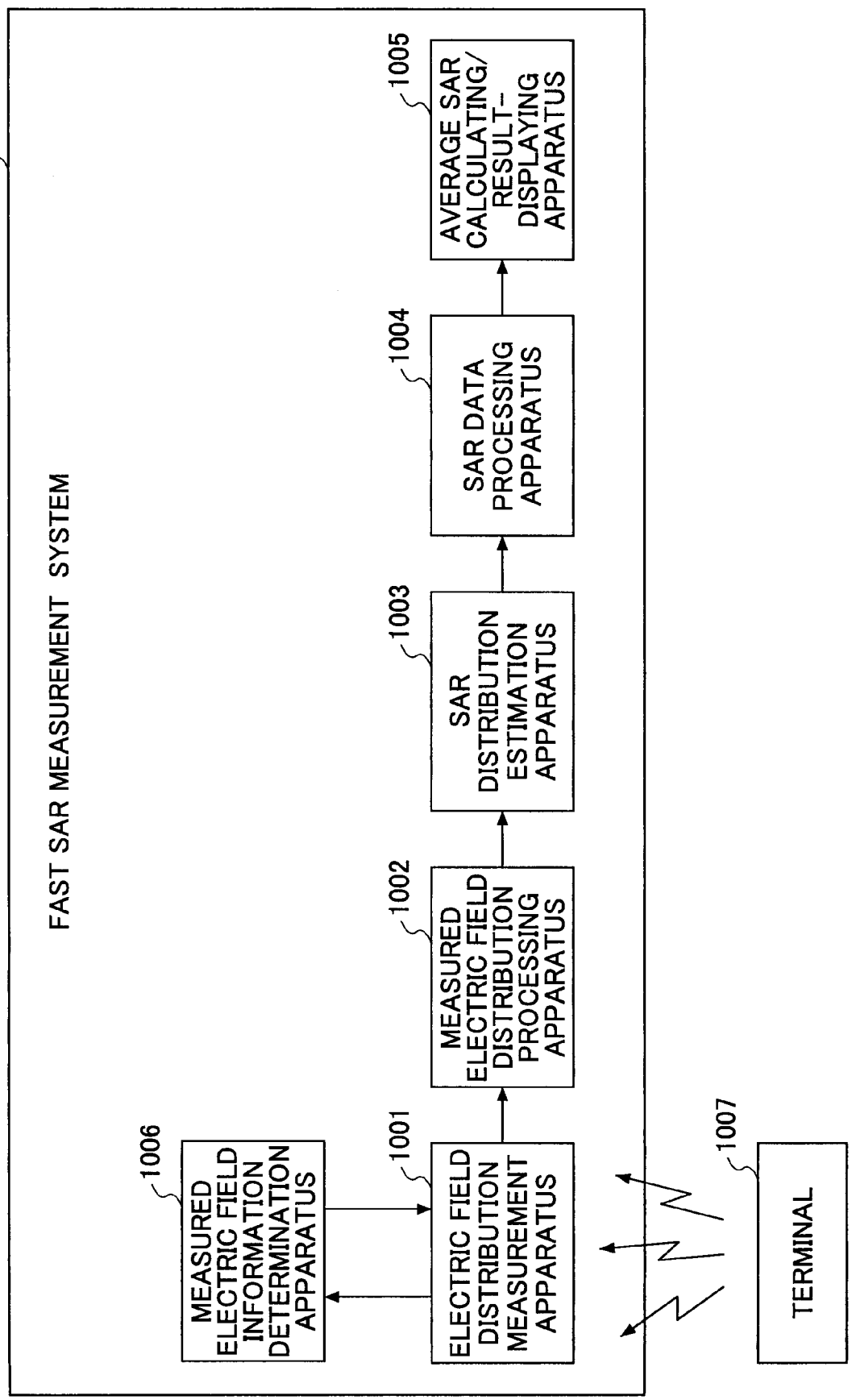
FIG. 10 is a functional block diagram of a fast SAR measurement process according to a fourth example of the present invention.

FIG. 10 is a functional block diagram of a fast SAR measurement process according to a fourth example of the present invention. In this example, a measured electric field information determination apparatus 1006 controls an electric field distribution measurement apparatus 1001 in such a manner that only the amplitude and phase of the electric field components parallel to the observation surface S are measured.

Figure 11:
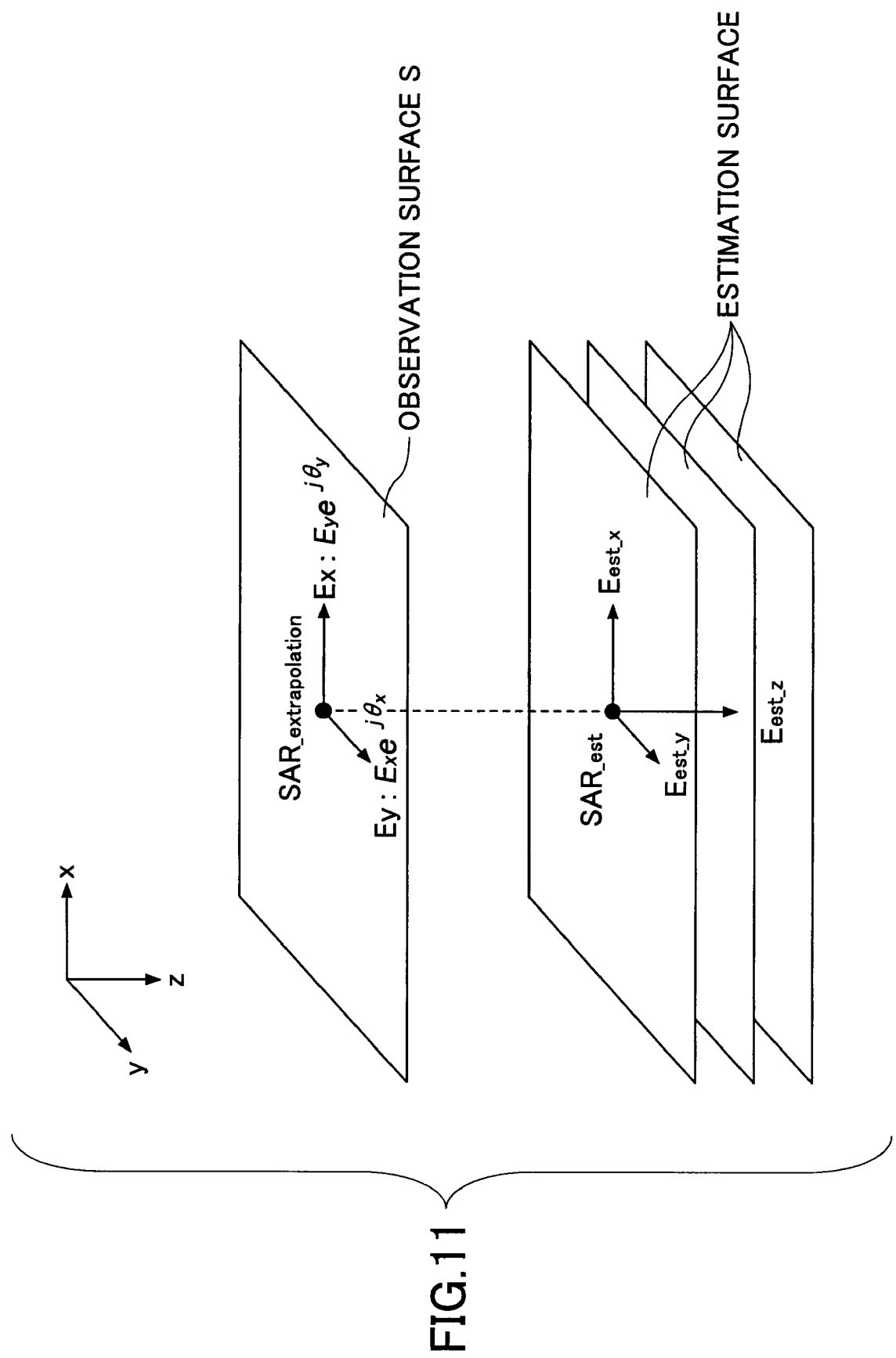
FIG. 11 shows electric field vectors in relation to an observation surface and an estimation surface.

FIG. 11 shows electric field coordinates in relation to the observation surface S and an estimation surface. Similar to the third example, both amplitude and phase of the electric field components parallel to the observation surface S, $E_x$ and $E_y$, are measured. However, no amplitude or phase is measured for the electric field component $E_z$ perpendicular to the observation surface S. As described above, regarding the electric field components at points away from the observation surface S, when the equation (2) is used, only the electric field components parallel to the observation surface S can contribute to the estimation result. Therefore, measuring the electric field component perpendicular to the observation surface S is not necessary. However, when calculating the SAR distribution in this example, the surfaces (estimation surfaces) excluding the observation surface S are considered, and extrapolation is applied by a SAR data processing apparatus 1004 to the electric field components or the SAR values that are estimated in accordance with the measurement data measured on the observation surface S so as to calculate the electric field component perpendicular to the observation surface S or the SAR value on the observation surface S. Any extrapolation known in this field of technology may be used. For example, spline method may be used as the extrapolation method.

According to this example, since only the electric field components parallel to the observation surface S are measured among all the electric field components, the measurement system can be simplified. For example, the number of the electric field detection probes can be reduced, thereby reducing the number of the measurement data to be taken. Therefore, fast measurement and processes become possible.

Example 5

Figure 12:
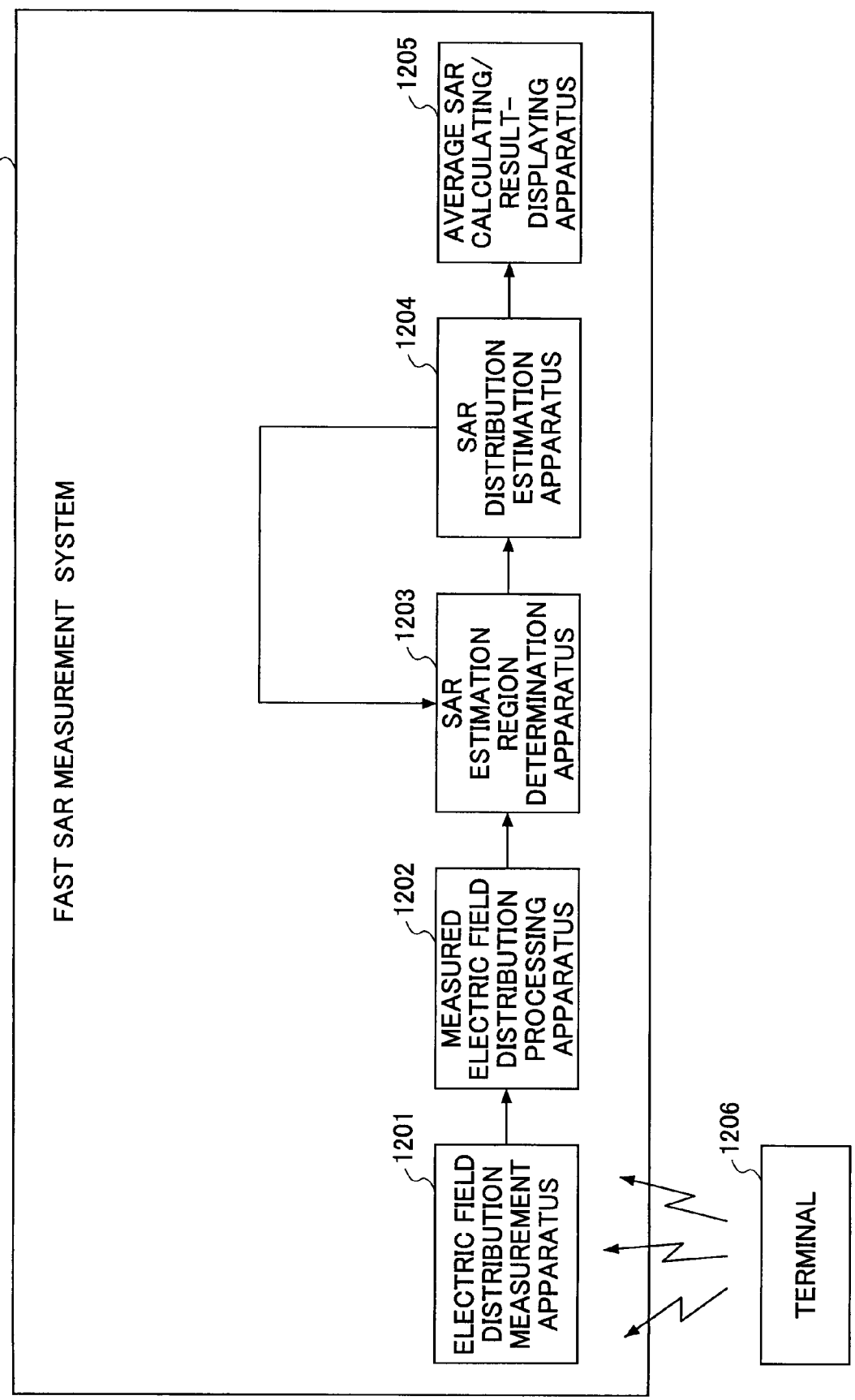
FIG. 12 is a functional block diagram of a fast SAR measurement process according to a fifth example of the present invention.

FIG. 12 is a functional block diagram of a fast SAR measurement process according to a fifth example of the present invention. In this example, a region subjected to the SAR estimation is arbitrarily adjusted by a SAR estimation region determination apparatus 1203.

Figure 13:
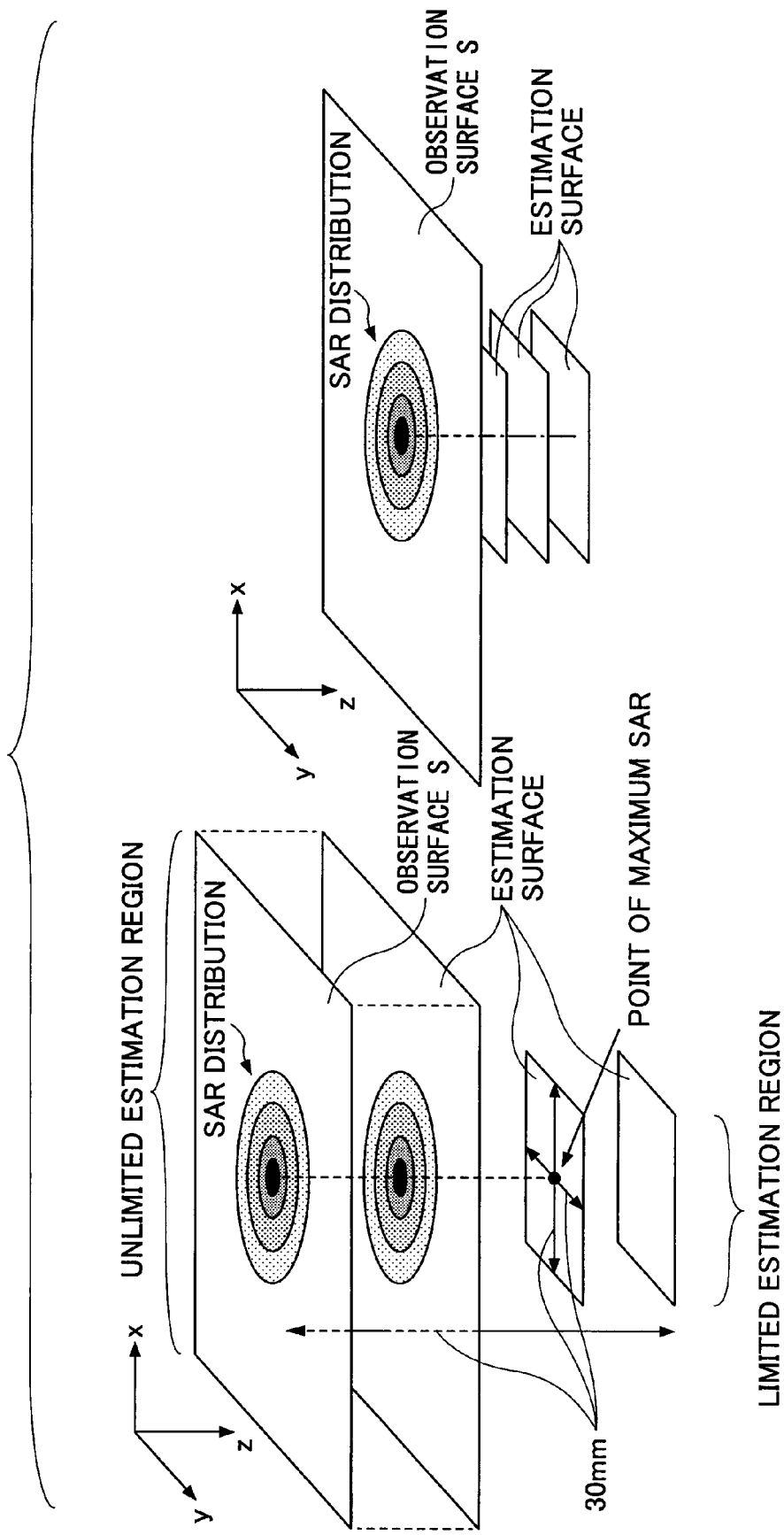
FIG. 13 shows a SAR distribution in relation to an observation surface and an estimation surface.

FIG. 13 shows electric field coordinates in relation to the observation surface S and the estimation surfaces. As shown in the left hand side of FIG. 13, the SAR distribution is calculated in a large region on one estimation surface among the plural estimation surfaces arranged parallel to the observation surface S, the large region being comparable with a measurement region on the observation surface S, whereas the SAR distribution is calculated only in a small region on the other estimation surfaces. The SAR distribution on the estimation surface with the large region is calculated using the equations (2) through (4). The SAR estimation region determination apparatus 1203 determines the region to be subjected to the SAR distribution calculation. Specifically, when it is determined as a result of a comparison between the observation surface S and the estimation surface having the large region that the SAR distribution shape and a point of the maximum SAR are the same between the two surfaces, the regions where the SAR distribution is calculated are limited to the vicinity of the point of the maximum SAR for the other estimation surfaces arranged along the depth direction. The region subjected to the SAR calculation may be changed depending on requirements. For example, the region may be a square region having sides 30 mm long at and around the point where the SAR value on the observation surface S becomes the maximum.

In addition, as shown in the right-hand side of FIG. 13, SAR calculation regions may be limited for all the estimation surfaces taking account of the SAR distribution on the observation surface S.

Since the point of the maximum SAR is particularly important in the SAR distribution calculation, elimination of points subjected to the calculation, except for the maximum point, is beneficial to improved efficiency of the SAR distribution calculation.

Example 6

Figure 14:
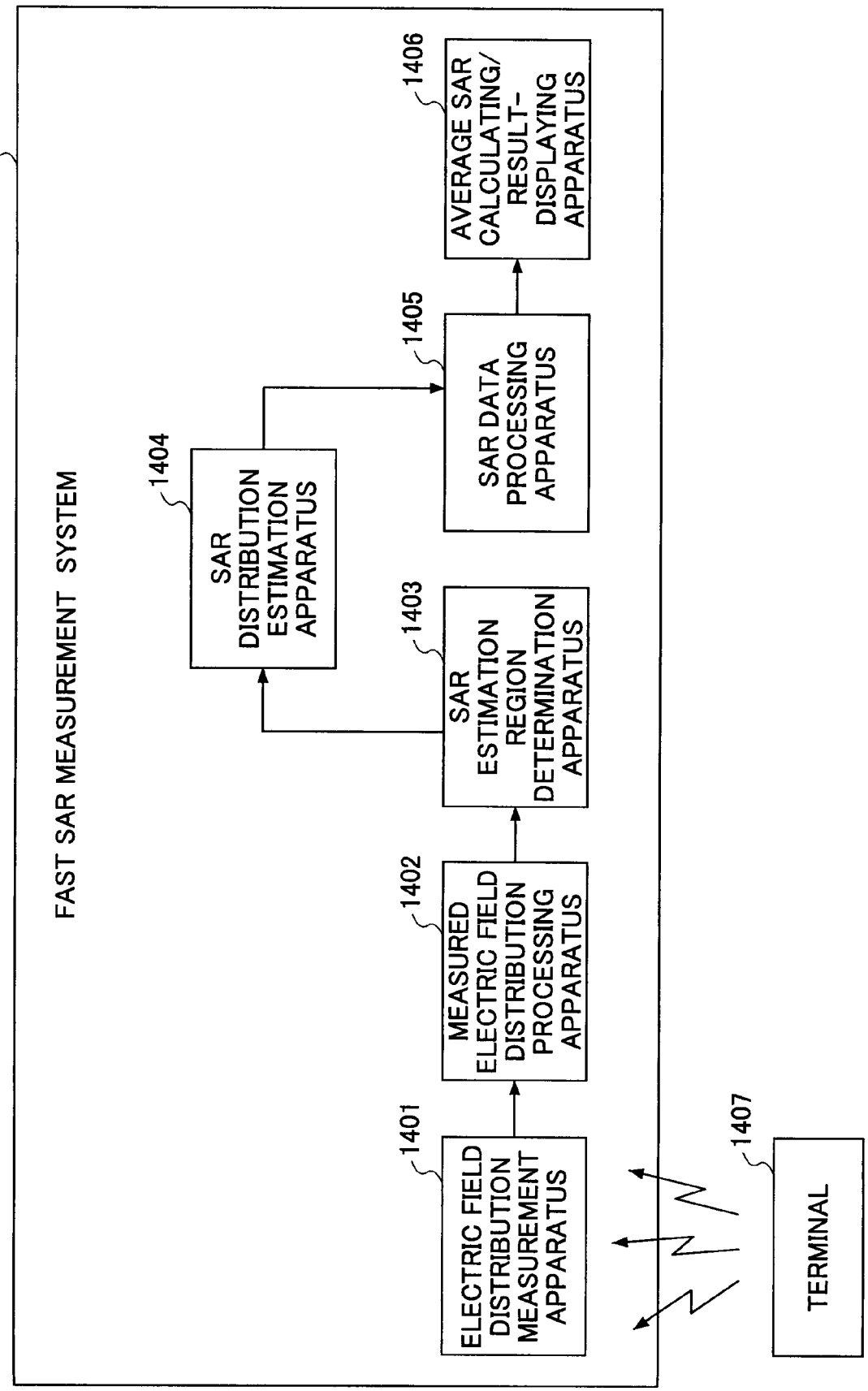
FIG. 14 is a functional block diagram of a fast SAR measurement process according to a sixth example of the present invention.
Figure 15:
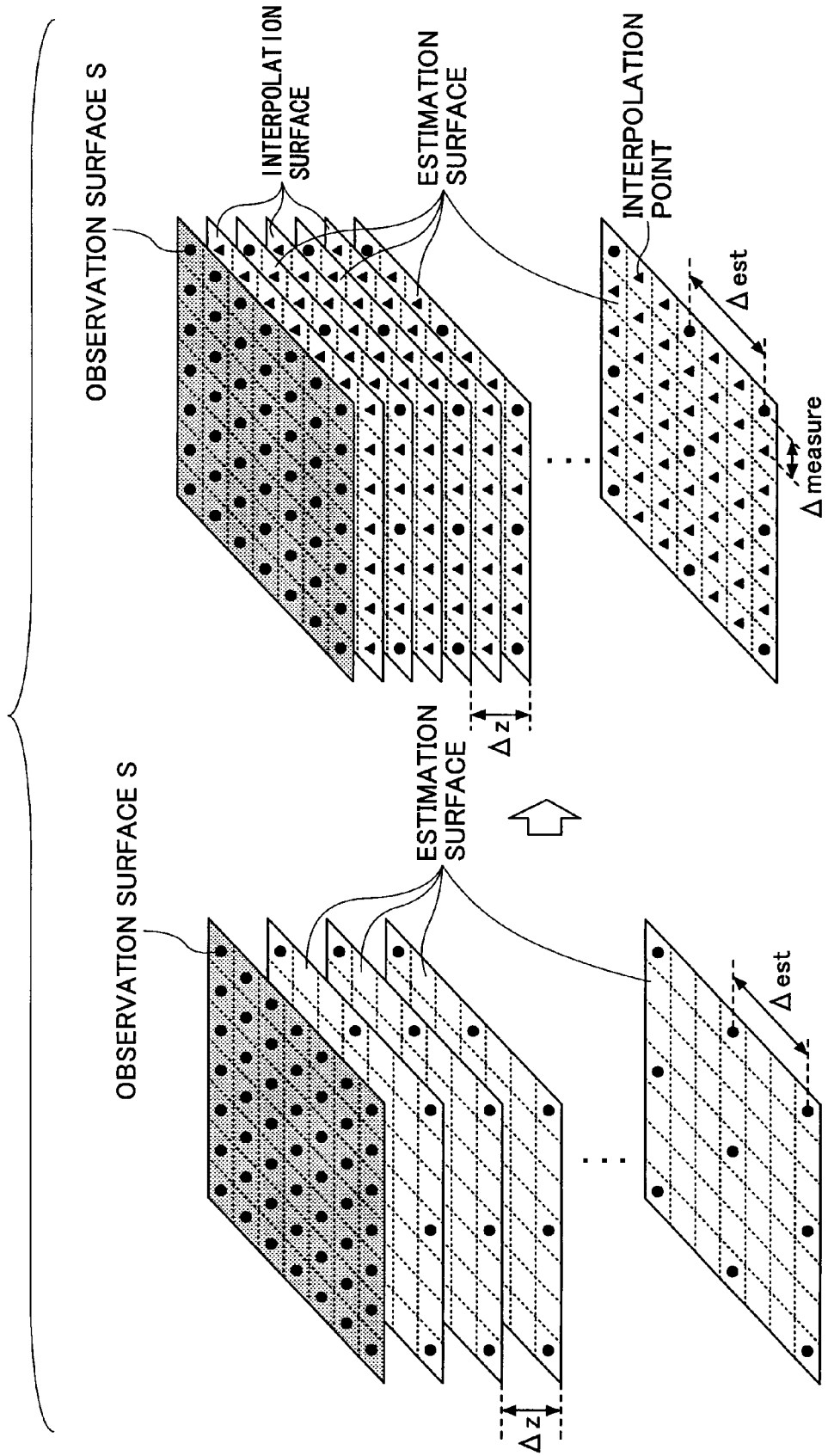
FIG. 15 shows a spatial relationship among an observation surface, an estimation surface, and an interpolation surface.

FIG. 14 is a functional diagram of a fast SAR measurement process according to a sixth example of the present invention. FIG. 15 shows electric field coordinates in relation to the observation surface S, the estimation surfaces, and interpolation surfaces.

In this example, electric field vectors are measured at the data intervals of $\Delta$measure for the observation surface S. For the estimation surfaces except for the observation surface S, the electric field vectors are estimated at intervals ($\Delta$est on the estimation surface, $\Delta z$ in the phantom depth direction) wider than $\Delta$measure ($\Delta$measure<$\Delta$est). The data intervals $\Delta$est on the estimation surface and the estimation surface intervals $\Delta z$ along the phantom depth direction are determined by a SAR estimation region determination apparatus 1403. A SAR data processing apparatus 1405 interpolates in accordance with a predetermined interpolation or extrapolation method the SAR distribution estimated based on the aforementioned coarse intervals so as to convert the SAR distribution to the SAR distribution with the desired data intervals $\Delta$measure. As only an example, $\Delta$est, $\Delta z$, and $\Delta$measure may be 8.0 mm, 5.0 mm, and 1.0 mm, respectively.

According to the calculation method of this example, the SAR distribution can be calculated much faster than a calculation method in which all the 3-dimensional electric field vectors are estimated at the same intervals as the measurement point intervals on the observation surface S (the electric field vectors are calculated at the data intervals $\Delta$measure for all the estimation surfaces) using the equations (2) through (4).

Example 7

Figure 16:
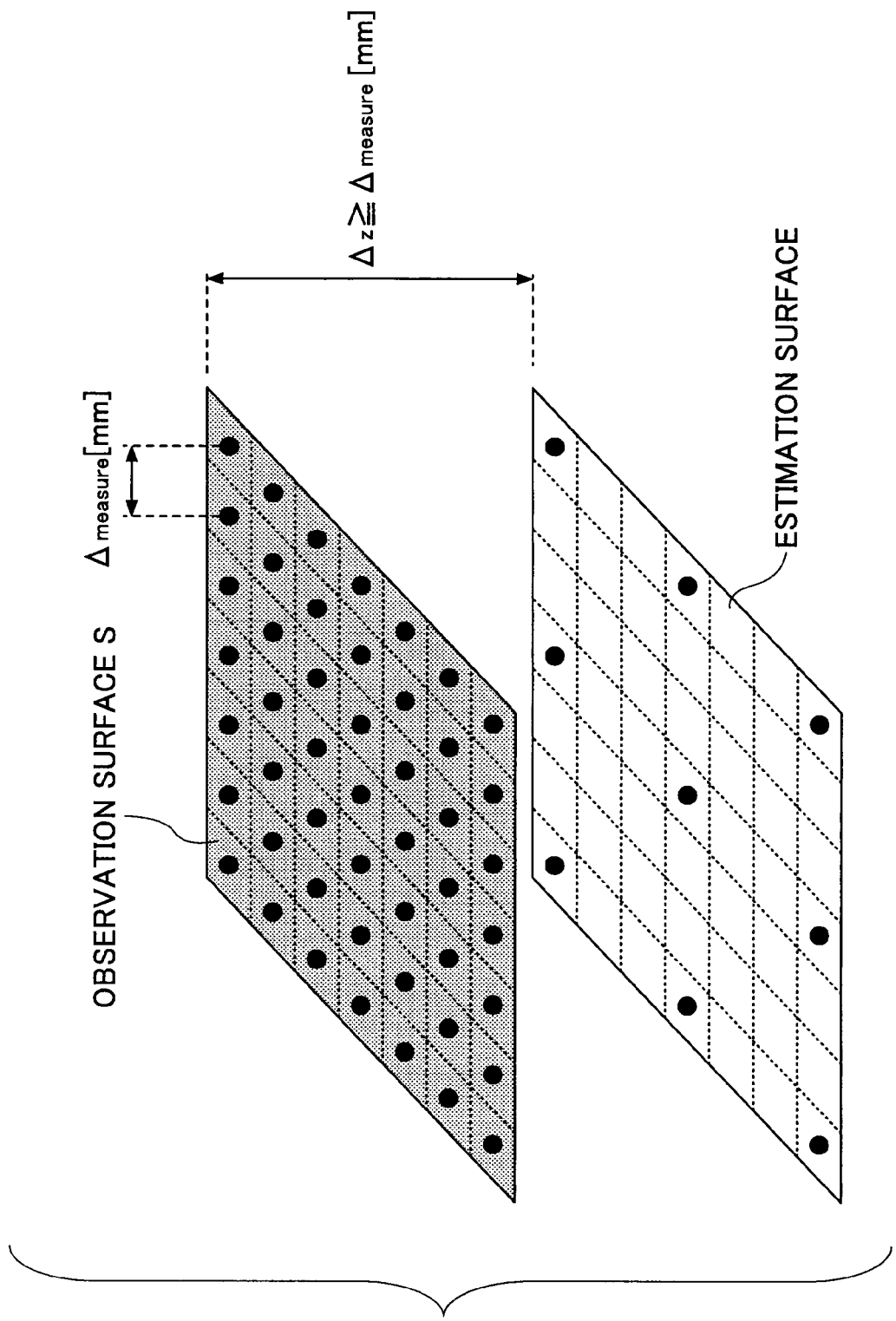
FIG. 16 shows a relationship between the observation surface and the estimation surface in a seventh example.

FIG. 16 shows a relationship between the observation surface and the estimation surface in a seventh example of the present invention. A distance between the observation surface S and the estimation surface is assumed as $\Delta z$. Here, the distance $\Delta z$ is taken along the z axis shown in FIG. 16 in this example. $\Delta z$ is larger than or equal to $\Delta$measure which is the data interval on the observation surface S ($\Delta z \geq \Delta$measure).

FIG. 17 shows the SAR calculation results on the estimation surface which is 1.0 mm away from the observation surface S ($\Delta z=1.0$ mm) while the data intervals $\Delta$measure on the observation surface are 1.0 mm, 2.0 mm, and 4.0 mm. "Calculation value" in FIG. 17 shows a theoretical value calculated without such estimation. As shown in FIG. 17, in the case of $\Delta$measure equaling 1.0 mm, which is the only case that satisfies $\Delta z \geq \Delta$measure, a result comparable with the theoretical value is obtained, whereas only inaccurate results are obtained in the other situations.

According to this example, the data intervals $\Delta$measure on the observation surface S and the estimation surface position $\Delta z$ are set so as to satisfy predetermined conditions, thereby easily improving accuracy in the electrical field distribution and the SAR distribution.

Example 8

Figure 18:
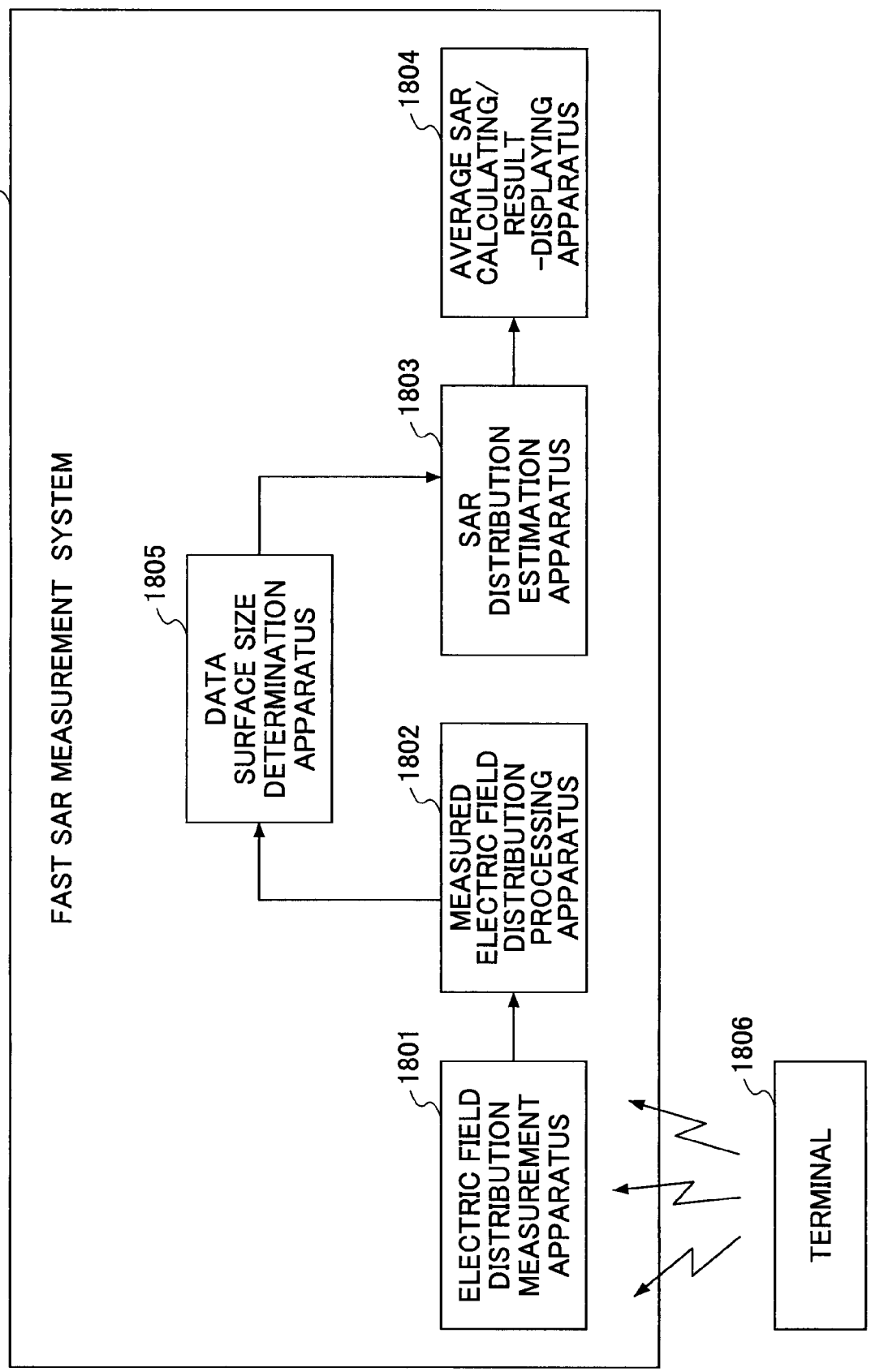
FIG. 18 a functional block diagram of a fast SAR measurement process according to an eighth example of the present invention.

FIG. 18 is a functional block diagram of a fast SAR measurement process according to an eighth example of the present invention. In this example, the electric field components at positions in the dielectric medium are calculated, making use of only part of the data on the observation surface S. A data surface size determination apparatus 1805 determines which data elements on the observation surface S are used and notifies an SAR distribution estimation apparatus 1803 of the determined result. Based on the equation (2), contributions from the electric field vectors on the observation surface S are obtained by performing a surface integral. Then, the electric field vectors at other positions are estimated in accordance with the obtained contributions. Therefore, the larger the number of the measured electric field vectors becomes, the larger the amount of the calculations becomes in order to obtain the electric field vectors at other positions.

Figure 19:
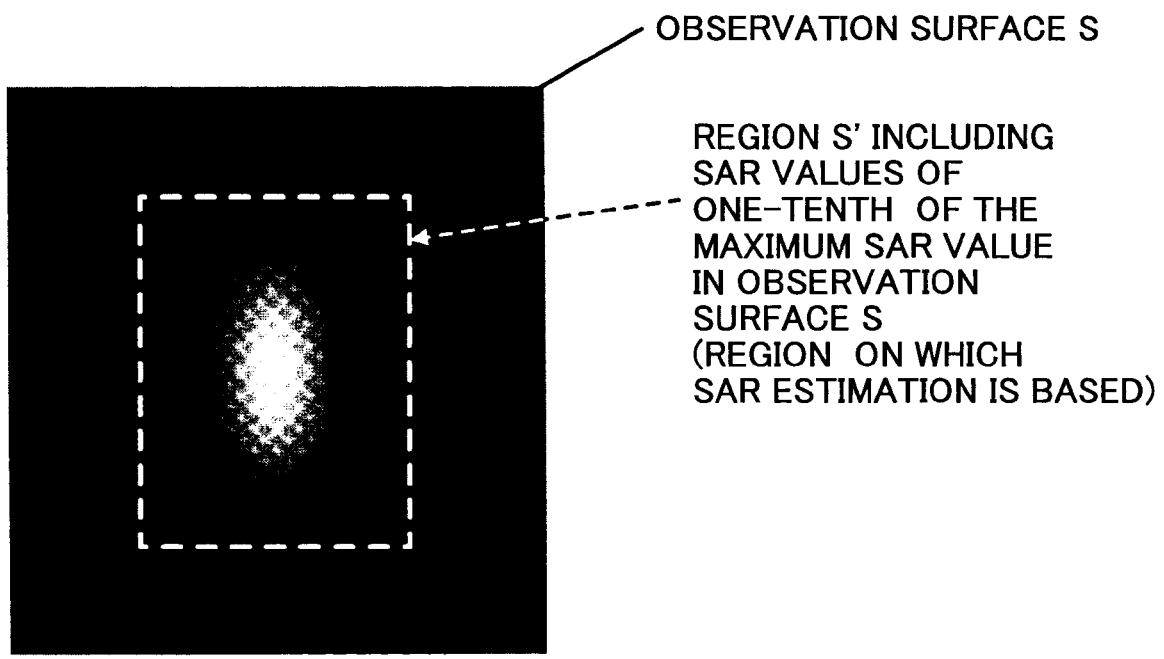
FIG. 19 shows a SAR distribution in an observation surface S.

For example, when the SAR distribution is calculated from the electric field vectors on the observation surface S, the electric field vectors at positions that are not on the observation surface can be calculated using the electric field vectors within a limited region S' surrounded by a dashed line in FIG. 19, the limited region S' including the SAR values that are one-tenth or more of the maximum SAR value on the observation surface S.

According to this example, while the number of measurement points for use in the SAR calculation is decreased, the electric field can be easily and efficiently calculated in other positions that are not on the observation surface.

Example 9

Figure 20:
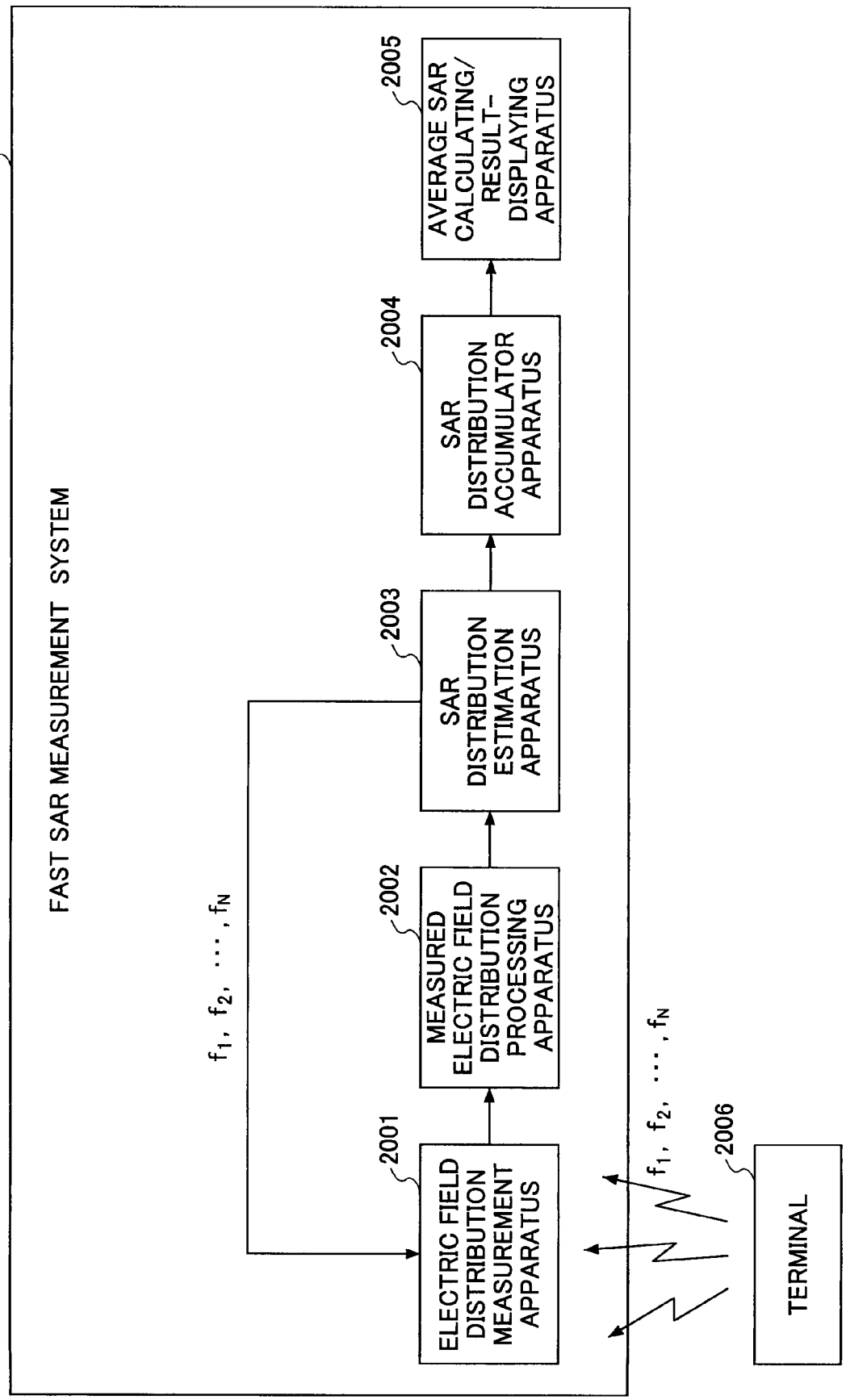
FIG. 20 is a functional block diagram of a fast SAR measurement process according to a ninth example of the present invention.

FIG. 20 is a functional block diagram of a fast SAR measurement process according to a ninth example of the present invention. In this example, N different electromagnetic waves having N different frequencies ($f_1, \ldots, f_N$) are emitted from a radiating source such as a mobile phone. In this case, plural electric fields are generated in the dielectric medium (phantom) and the plural electric fields are measured for corresponding frequencies. For example, use of an electric field detection probe composed of an electro-optic (EO) crystal allows for the measurements for individual frequencies. Then, an SAR distribution estimation apparatus 2003 prepares the SAR distribution for individual frequencies in accordance with electric field vectors measured and collected for individual frequencies. By the way, the electric field vectors are measured for one frequency after another by changing in a time-wise manner the frequencies of an electric field distribution measurement apparatus 2001 in the example illustrated here. However, the electric field vectors may be measured concurrently by preparing plural measurement portions for corresponding frequencies. A SAR distribution accumulator apparatus 2004 superposes the N SAR distributions obtained for the corresponding frequencies so as to calculate the overall SAR distribution.

According to this example, even if plural frequencies are included in the electromagnetic waves from the radiating source, the SAR distribution can be obtained by a simplified method.

Example 10

Figure 21:
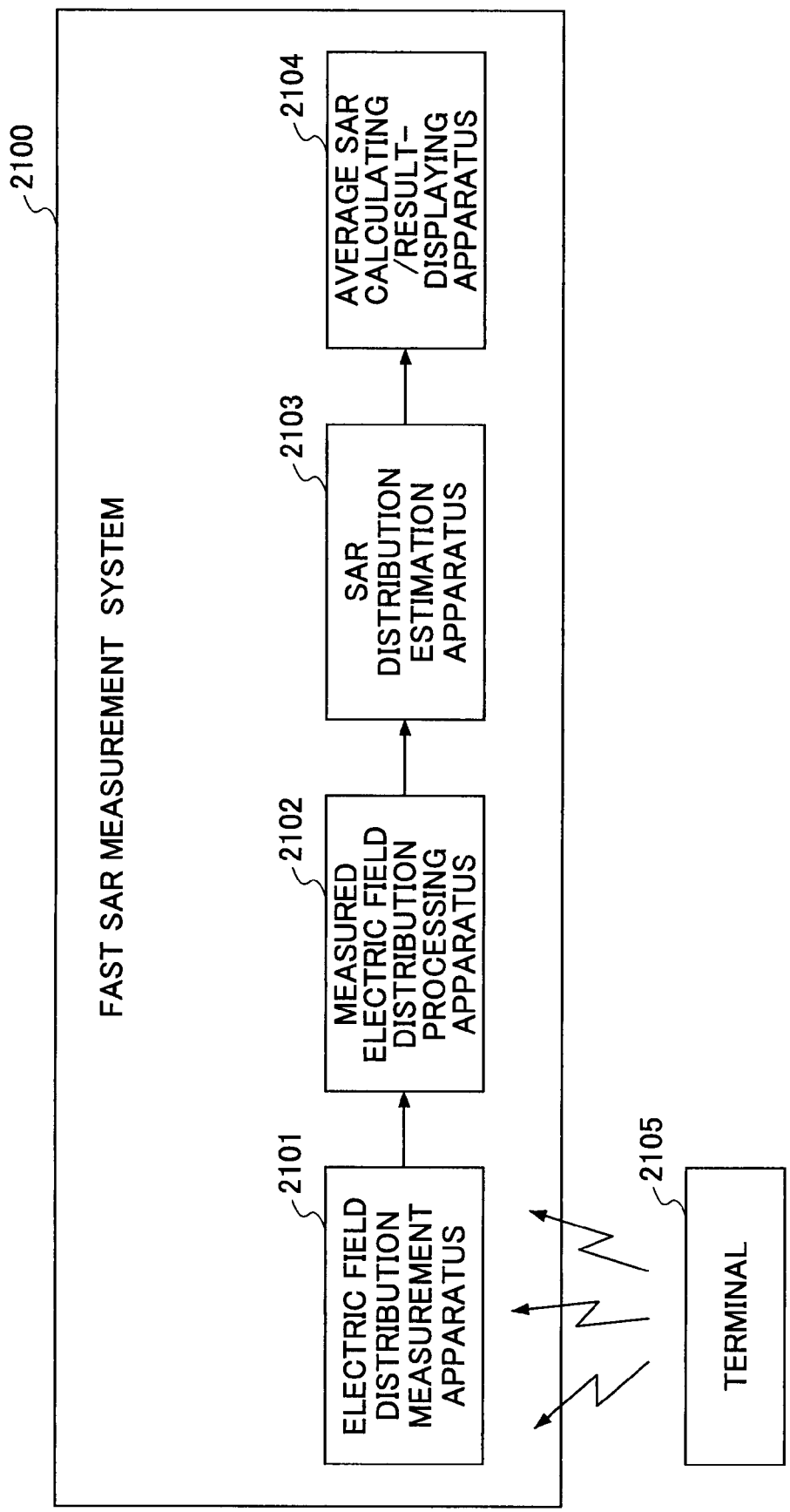
FIG. 21 is a functional block diagram of a fast SAR measurement system according to a tenth example of the present invention.
Figure 22:
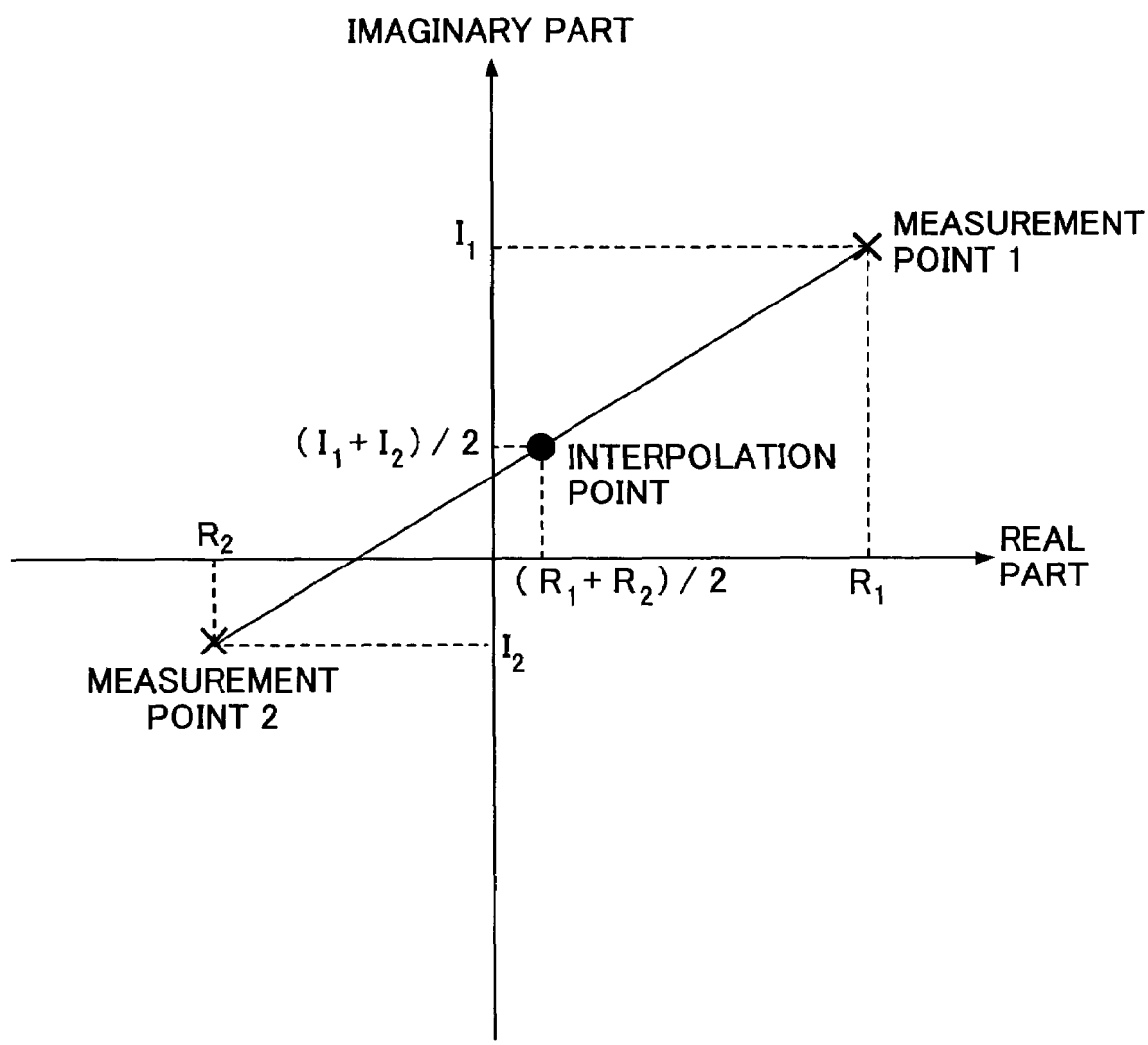
FIG. 22 shows a relationship between measurement points and an interpolated point.

FIG. 21 is a functional block diagram of a fast SAR measurement process according to a tenth example of the present invention. The measurement data intervals Δmeasure for the electric field distribution on the observation surface S have to be appropriately set in order that a SAR distribution estimation portion 2103 calculates the SAR distribution highly accurately. If the data intervals Δmeasure are coarse in an electric field distribution measurement apparatus 2101, interpolation is performed by a measured electric field distribution processing apparatus 2102 so that the apparent data intervals are reduced. In this example, after the amplitude and phase of the electric field measured by the electric field distribution measurement apparatus 2101 are converted into a real part and an imaginary part (complex number), the complex number is interpolated in a manner shown in FIG. 22 in the measured electric field distribution processing apparatus 2102. Any interpolation method known in this field of technology may be used. For example, linear interpolation is used in FIG. 22.

Such interpolation enables highly accurate estimation of the electric field distribution in the dielectric medium except for the observation surface.

Example 11

Figure 23:
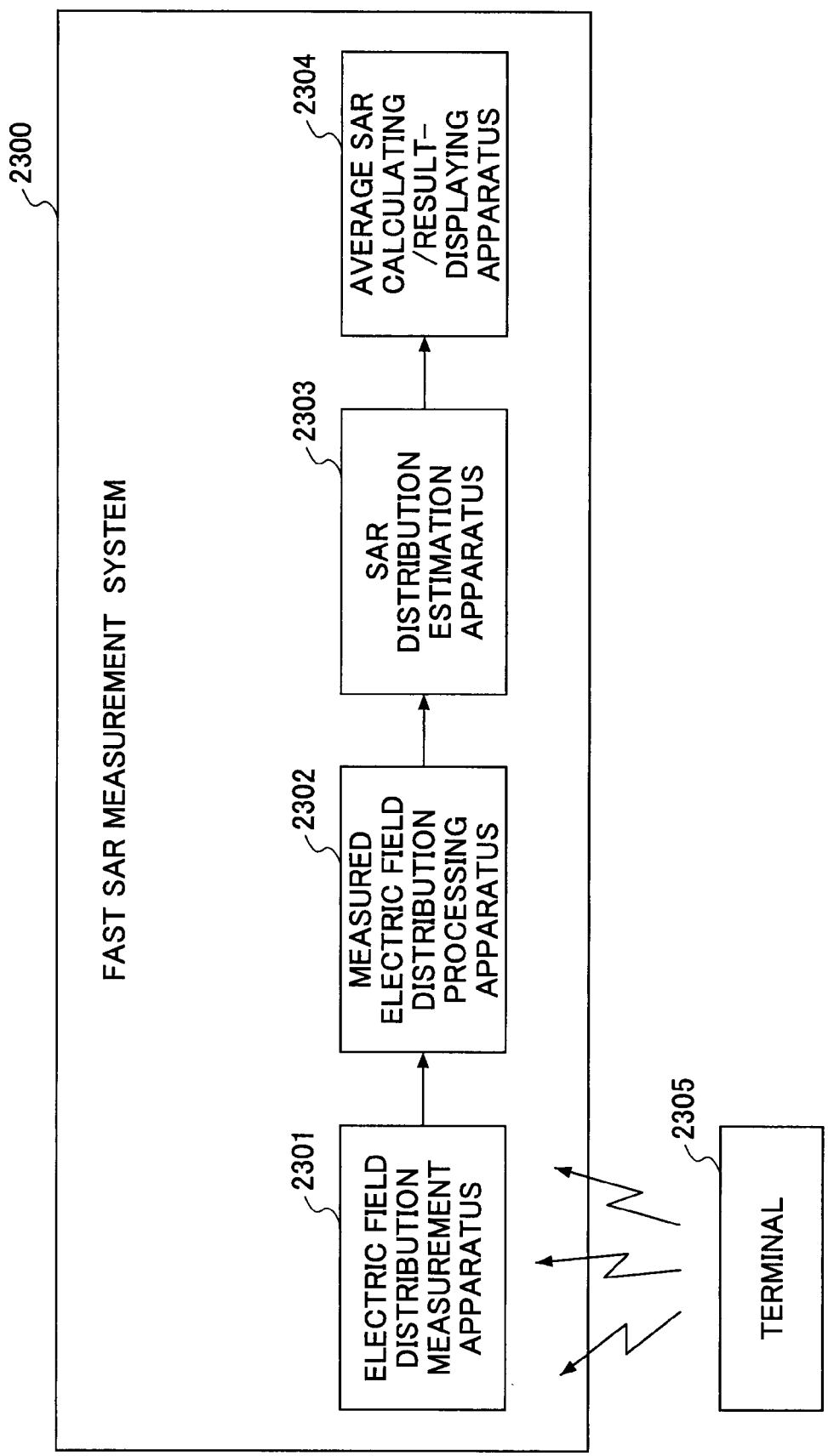
FIG. 23 is a functional block diagram of a fast SAR measurement system according to an eleventh example of the present invention.

FIG. 23 is a functional block diagram of a fast SAR measurement process according to an eleventh example of the present invention. In this example, a measured electric field distribution processing apparatus 2302 smoothes the measured data of electric field vectors on the observation surface S and the SAR distribution is calculated using the smoothed electric field vectors. Smoothing (and/or averaging) can reduce the influence of instantaneous fluctuations in electric field distribution caused in the measurement.

Figure 24:
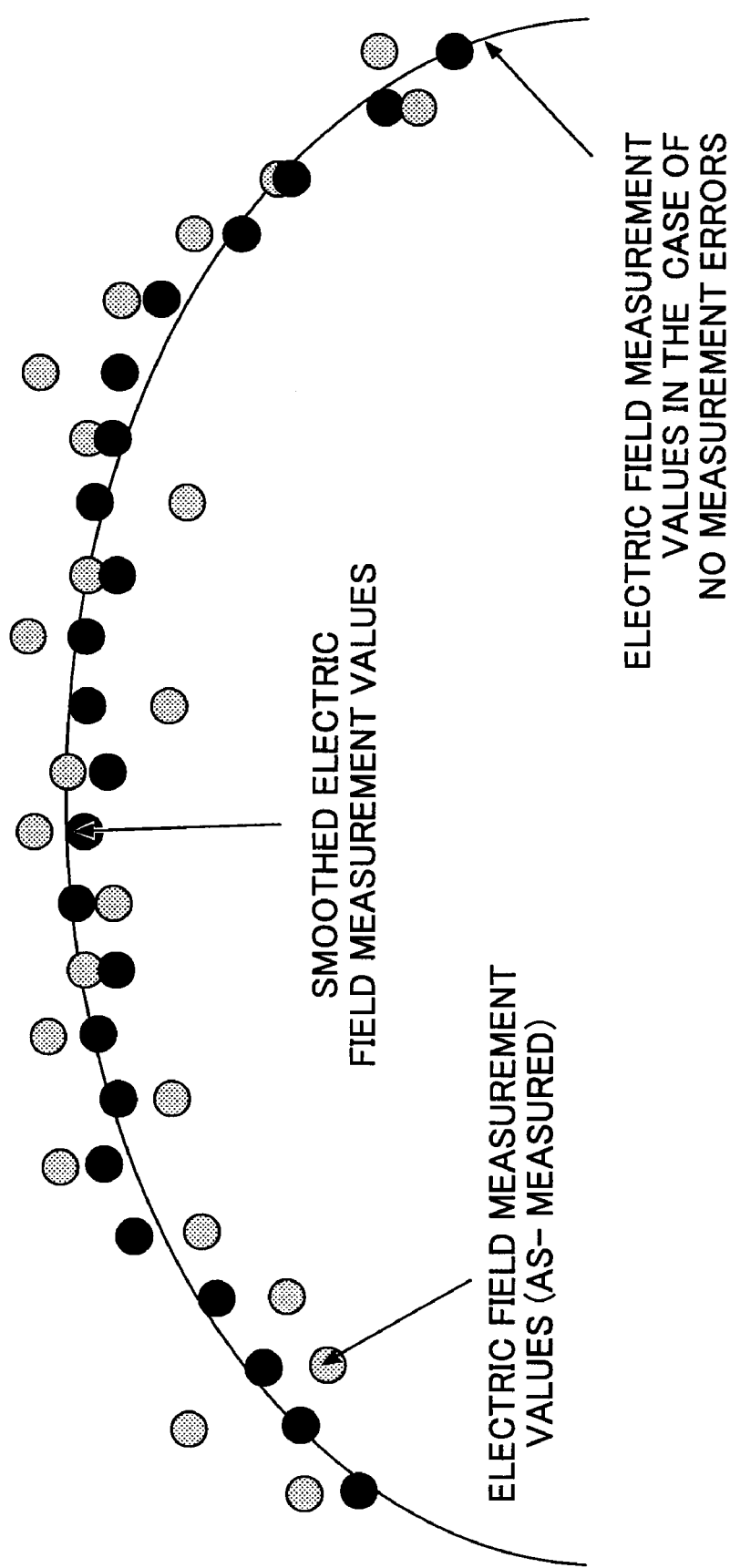
FIG. 24 schematically shows a relationship between measurement data and smoothed data.

FIG. 24 schematically shows measured electric field values and the smoothed values. Only as an example, smoothing is performed by a method of moving averaging. According to the smoothing, fluctuations are eliminated so that values closer to the theoretical data rather than the measured data are obtained.

According to this example, highly accurate SAR calculation is realized by smoothing so as to average out instantaneous measurement errors.

Example 12

Figure 25:
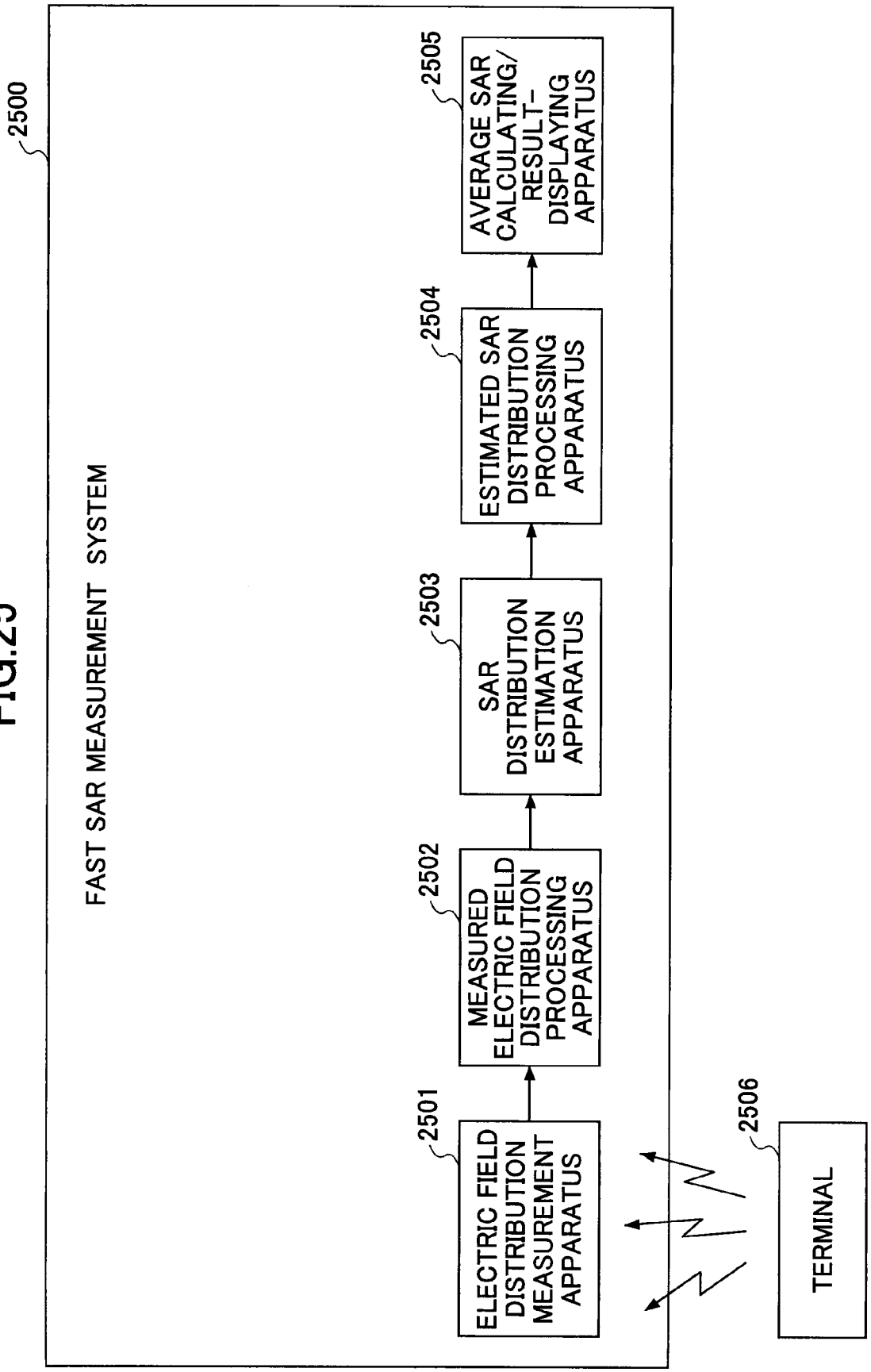
FIG. 25 is a functional block diagram of a fast SAR measurement system according to a twentieth example of the present invention.
Figure 26:
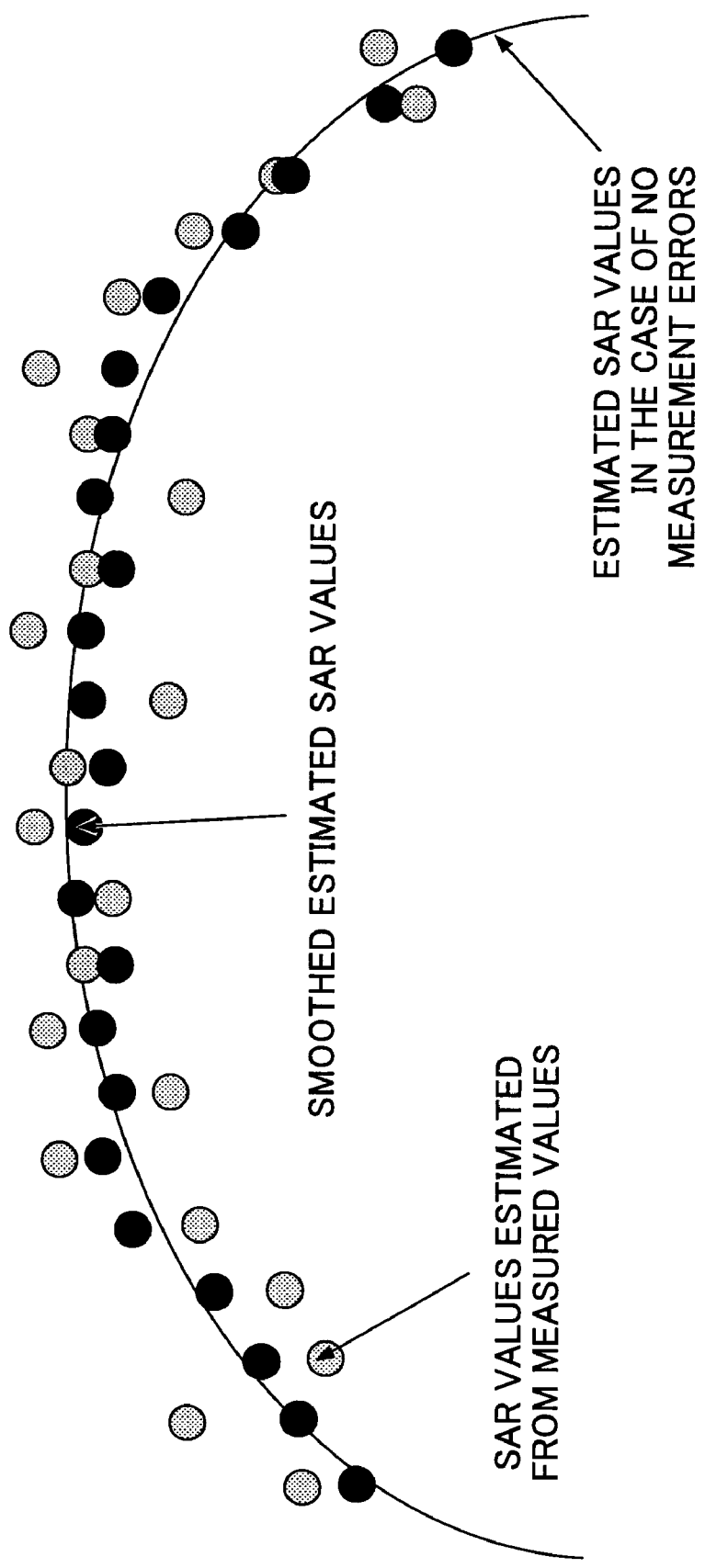
FIG. 26 schematically shows a relationship between measurement data and smoothed data.

FIG. 25 is a functional block diagram of a fast SAR measurement process according to a twelfth example of the present invention. In this example, an estimated SAR distribution processing apparatus 2504 performs smoothing on the estimated SAR distribution. FIG. 26 schematically shows estimated SAR values and the smoothed SAR values.

When the electric field fluctuates during the measurement, the SAR estimation data fluctuate accordingly. However, such fluctuations in the SAR estimation can be averaged out since the estimated SAR distribution is smoothed in this example. Therefore, the SAR distribution calculation becomes more reliable.

Various examples have been individually described above, those examples have not to be practiced individually but a combination of two or more examples may be applicable depending on intended purposes.

The present application contains subject matter related to Japanese patent applications No. 2006-287607 and No. 2007-113533, filed with the Japanese Patent Office on Oct. 23, 2006 and Apr. 23, 2007, respectively, the entire contents of which are incorporated herein by reference.

What is claimed is:

1. A specific absorption rate measurement system that measures a specific absorption rate of electromagnetic waves from a radiating source absorbed in a dielectric medium, the system comprising:

a measurement portion that measures a first electric field vector on an observation surface which is a two-dimensional surface in the dielectric medium;

an electric field calculation portion that calculates a second electric field vector in a point excluded from the observation surface in accordance with electric field components of the first electric field vector measured on the observation surface, the electric field components being parallel to the observation surface; and a calculation portion that calculates the specific absorption rate from the calculated second electric field vector.

2. The specific absorption rate measurement system of claim 1, wherein the measurement portion comprises an optical probe including an electro-optic crystal so as to measure amplitude and phase of each of the electric field components of the first electric field vector on the observation surface in the dielectric medium.

3. The specific absorption rate measurement system of claim 1, wherein the measurement portion comprises an electric field probe including a small dipole antenna and an optical waveguide modulator so as to measure amplitude and phase of each of the electric field components of the first electric field vector on the observation surface in the dielectric medium.

4. The specific absorption rate measurement system of claim 1, wherein the measurement portion comprises plural probes that measure amplitude and phase of each of the electric field components of the first electric field vector at a given point in the dielectric medium.

5. The specific absorption rate measurement system of claim 1, wherein the electric field calculation portion surface-integrates a vector obtained from a first exterior product of a second exterior product and a gradient of Green's function, the second exterior product being an exterior product of the electric field components parallel to the observation surface and a normal vector to the observation surface, so as to calculate the second electric field vector in the point excluded from the observation surface.

6. The specific absorption rate measurement system of claim 1, wherein incidence of the electromagnetic waves on surfaces of the dielectric medium, the surfaces excluding a dielectric medium surface that faces the radiating source, is negligible; and wherein the dielectric medium is so large that reflection of the electromagnetic waves inside the dielectric medium is negligible.

7. The specific absorption rate measurement system of claim 1, wherein the measurement portion measures amplitude and phase of the electrical field components parallel to the observation surface.

8. The specific absorption rate measurement system of claim 7, wherein the measurement portion further measures amplitude of an electrical field component perpendicular to the observation surface.

9. The specific absorption rate measurement system of claim 1, wherein the electric field calculation portion calculates the second electric field vector at estimation points on an estimation surface that is substantially parallel to the observation surface, where the number of the estimation points is substantially the same as the number of measurement points in which the first electric field vectors are measured on the observation surface when the estimation surface exists within a predetermined distance from the observation surface, and the number of the estimation points is less than the number of the measurement points when the estimation surface exists outside the predetermined distance; and wherein the calculation portion calculates the specific absorption rate from the second electric field vector calculated on the estimation surface by the electric field calculation portion.

10. The specific absorption rate measurement system of claim 1, further comprising a first interpolation portion that interpolates so as to increase the number of second electric field vector data elements calculated on an estimation surface substantially parallel to the observation surface by the electric field calculation portion to be substantially the same number as the number of measurement points in which the first electric field vectors are measured on the observation surface by the electric field measurement portion;

wherein the specific absorption rate calculating portion calculates the specific absorption rate from the second electric field vector data elements whose number is the same as the number of the measurement points.

11. The specific absorption rate measurement system of claim 1, further comprising a second interpolation portion that interpolates so as to increase the number of specific absorption rate data elements calculated by the specific absorption rate calculation portion to be substantially the same number as the number of measurement points in which the first electric field vectors are measured on the observation surface by the electric field measurement portion.

12. The specific absorption rate measurement system of claim 1, wherein the electric field calculation portion calculates the second electric field vector at estimation points on an estimation surface that is substantially parallel to the observation surface, and wherein intervals of the measurement points measured on the observation surface are less than or equal to a distance between the observation surface and the estimation surface.

13. The specific absorption rate measurement system of claim 1, wherein the electric field calculation portion calculates the second electric field vector in a point excluded from the observation surface in accordance with the first electric field vector measured on a partial region of the observation surface, the partial region including a maximum point in which the maximum electric field or specific absorption rate value is obtained.

14. The specific absorption rate measurement system of claim 1, wherein the electromagnetic waves include plural frequencies, wherein plural of the first electric field vectors on the observation surface are measured for each of the plural frequencies;

wherein plural of the second electric field vectors are calculated from the corresponding plural first electric field vectors measured for each of the plural frequencies; and wherein the specific absorption rates are calculated from the corresponding second electric field vectors so as to obtain an overall specific absorption rate by combining the calculated specific absorption rates.

15. The specific absorption rate measurement system of claim 1, wherein the first electric field vector measured on the observation surface is expressed in the form of a complex number and interpolation is performed on a real part and an imaginary part of the complex number.

16. The specific absorption rate measurement system of claim 1, wherein the first electric field vectors are measured on the observation surface; wherein the first electric field vectors are smoothed or averaged so as to obtain a smoothed or an averaged value of the first electric field vectors; and wherein the smoothed or averaged value is used to calculate the specific absorption rate.

17. The specific absorption rate measurement system of claim 1, wherein the first electric field vectors are measured on the observation surface; wherein the specific absorption rates are calculated from the second electric field vectors calculated from the first electric field vectors; and wherein the calculated SAR values are smoothed or averaged.

18. A specific absorption rate measurement method that measures a specific absorption rate of electromagnetic waves from a radiating source absorbed in a dielectric medium, the method comprising steps of:

measuring a first electric field vector on an observation surface which is a two-dimensional surface in the dielectric medium;

calculating a second electric field vector at a position excluded from the observation surface in accordance with electric field components of the electric field measured on the observation surface; and calculating the specific absorption rate from the calculated second electric field vector.

19. The specific absorption rate measurement method of claim 18, wherein amplitude and phase of the electric field components parallel to the observation surface are measured in the measuring step.

20. The specific absorption rate measurement method of claim 19, wherein amplitude of an electrical field component perpendicular to the observation surface is further measured in the measuring step.

\* \* \* \* \*